US012787863B2

(12) United States Patent
Morein et al.

(10) Patent No.: US 12,787,863 B2
(45) Date of Patent: Nov. 3, 2026

(54) MICROELECTRONIC ASSEMBLIES INCLUDING STACKED DIES COUPLED BY A THROUGH DIELECTRIC VIA

(71) Applicant: Intel Corporation, Santa Clara, CA (US)

(72) Inventors: Stephen Morein, San Jose, CA (US); Ravindranath Vithal Mahajan, Chandler, AZ (US); Prashant Majhi, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 257 days.

(21) Appl. No.: 17/854,728

(22) Filed: Jun. 30, 2022

(65) Prior Publication Data

US 2024/0006381 A1 Jan. 4, 2024

(51) Int. Cl.
*H10W 90/00* (2026.01)
*H10W 72/00* (2026.01)

(52) U.S. Cl.
CPC .......... *H10W 90/00* (2026.01); *H10W 72/823* (2026.01)

(58) Field of Classification Search
None
See application file for complete search history.

(56) References Cited

U.S. PATENT DOCUMENTS

| | | | |
|---|---|---|---|
| 8,612,809 B2 | 12/2013 | Casper et al. | |
| 8,737,108 B2 | 5/2014 | Saraswat et al. | |
| 9,147,672 B1 * | 9/2015 | Chen | H01L 25/18 |
| 10,134,712 B1 * | 11/2018 | Veches | H01L 25/0657 |
| 2011/0309521 A1 | 12/2011 | Dunne | |
| 2020/0006221 A1 * | 1/2020 | Zhang | H01L 25/0657 |
| 2020/0273844 A1 | 8/2020 | Hirano et al. | |
| 2020/0321315 A1 | 10/2020 | Yu et al. | |
| 2021/0366873 A1 | 11/2021 | Gandhi et al. | |
| 2022/0013494 A1 | 1/2022 | Huang et al. | |

* cited by examiner

*Primary Examiner* — Hung K Vu
(74) *Attorney, Agent, or Firm* — Akona IP PC

(57) ABSTRACT

Disclosed herein are microelectronic assemblies, as well as related apparatuses and methods. In some embodiments, a microelectronic assembly may include a plurality of vertically stacked dies; a trench of dielectric material through the plurality of vertically stacked dies; and a plurality of conductive vias extending through the trench of dielectric material, wherein individual ones of the plurality of conductive vias are electrically coupled to individual ones of the plurality of vertically stacked dies.

20 Claims, 28 Drawing Sheets

MICROELECTRONIC ASSEMBLIES INCLUDING STACKED DIES COUPLED BY A THROUGH DIELECTRIC VIA

BACKGROUND

Integrated circuit (IC) packages commonly include stacked dies. Die stacking includes the process of mounting multiple chips on top of one another within a single IC package. Die stacking has recently emerged as a powerful tool for satisfying requirements for increased demands of processing capability and storage capacity. Die stacking is used in many different computer products and further improvements are always desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1A:
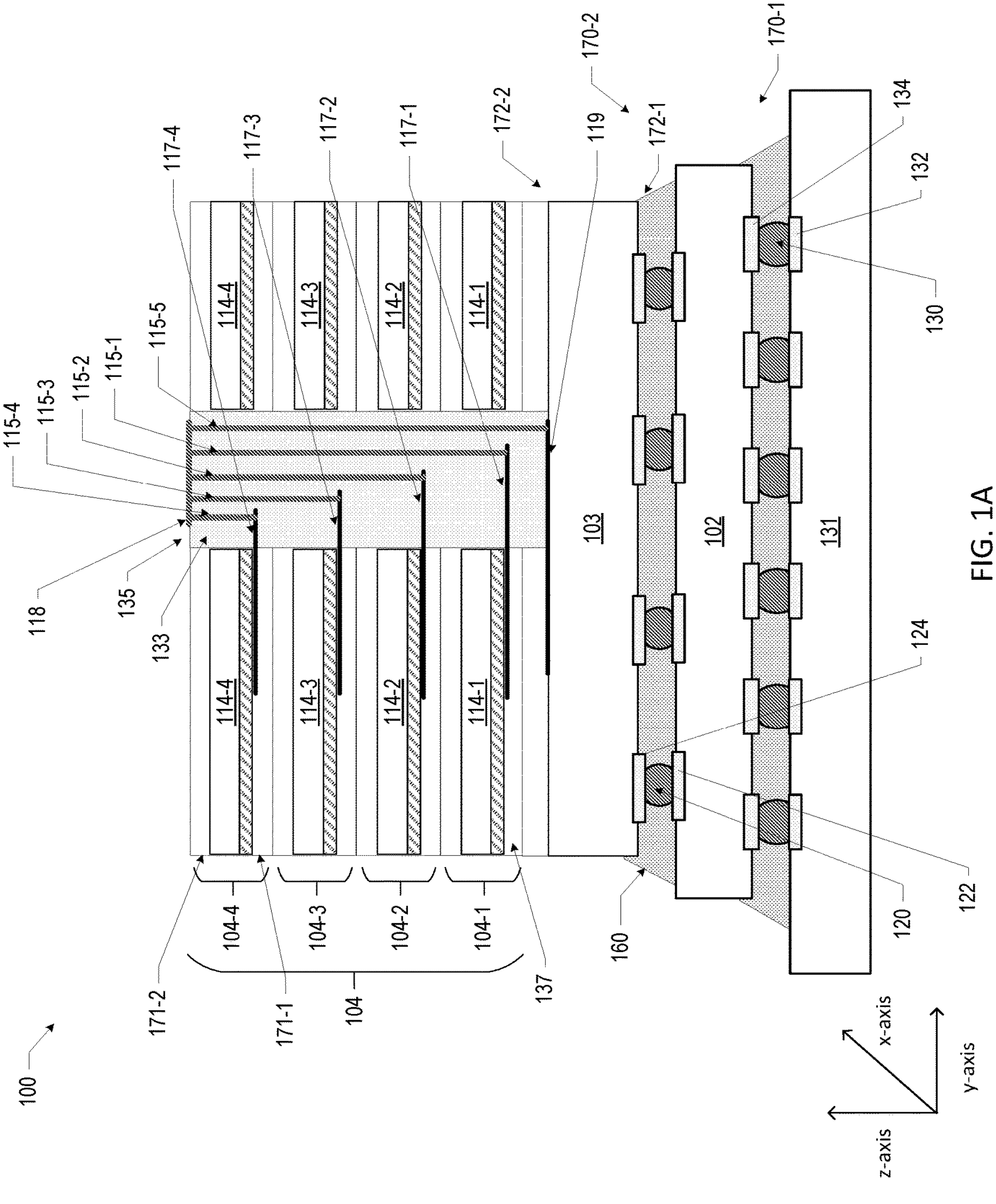
FIG. 1A is a side, cross-sectional view of an exemplary microelectronic assembly, in accordance with various embodiments.

Disclosed herein are microelectronic assemblies, as well as related apparatuses and methods. For example, in some embodiments, a microelectronic assembly may include a plurality of vertically stacked dies; a trench of dielectric material through the plurality of vertically stacked dies; and a plurality of conductive vias extending through the trench of dielectric material, wherein individual ones of the plurality of conductive vias are electrically coupled to individual ones of the plurality of vertically stacked dies.

IC packages having a number of vertically stacked chips or die in a single package (i.e., die stacking) advantageously increase the amount of processing and/or memory that can be located within a given footprint on the substrate or printed circuit board on which the die stack is arranged. Die stacking may enable shorter routing interconnects from chip to chip, thus increasing signal speeds between chips, reducing noise, and reducing cross-talk. Another benefit of die stacking is that surface-mount to printed circuit board assembly is simplified because fewer components are required to be placed on the printed circuit board. As processing demands and storage capacity continue to increase, while system size continues to decrease, die stacking is becoming increasingly useful for different memory configurations. An example IC assembly may include a compute logic die and a stack of memory dies coupled to the compute logic die (i.e., the compute logic die and the memory dies are arranged according to 3D integration). The memory dies may include static random-access memory (SRAM) cells, dynamic random-access memory (DRAM), resistive switching memory (e.g., magnetoresistive random-access memory (MRAM) or resistive random-access memory (RRAM)), spin-transfer torque random-access memory (STTRAM) cells, etc. Although descriptions of the present disclosure may refer to compute logic devices (e.g., implemented using frontend transistors, referred to herein as logic transistors) or memory cells included in a given die of an IC assembly, any of the dies described herein may also include other types of devices. For example, in some embodiments, any of the memory dies described herein may also include logic transistors, and/or any of the compute logic dies described herein may also include memory cells. Furthermore, some embodiments of the present disclosure may refer to memory dies, however, embodiments of the present disclosure are equally applicable to other dies, including processing dies, such as central processing units (CPUs), or graphic processing units (GPUs). For example, unless described otherwise, dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of input/output (I/O) functions, arithmetic operations, pipelining of data, etc.). The term "circuit" may be used to describe one or more passive and/or active components that are arranged to cooperate with one another to provide a desired function.

Memory is important to the performance of IC packages. Typically, stacked memory assemblies include one or more memory arrays and control circuitry for the memory arrays arranged in vertical layers with interconnects between the layers to electrically couple the tiers of memory, which increases an overall thickness of an IC package. To provide more dense memory for computing operations, architectures involving memory devices (which may be referred to as three-dimensional (3D) stacked memory, or stacked memory) having a plurality of closely coupled memory elements have been developed. A 3D stacked memory may include coupled layers or packages of memory elements, which may be referred to as a memory stack. Stacked memory may be utilized to provide a great amount of computer memory in a single device or package, where the device or package may also include certain system components, such as a memory controller and CPU (central processing unit). Current practice for assembling a 3D stack, such as a memory stack, includes having through silicon vias (TSVs) in each tier of memory and electrically coupling each tier by solder microbumps or, more recently, by hybrid bonding. This increases complexity and cost by requiring the formation of TSVs and interconnect metallization at each tier and is more likely to result in decreased yields as a failure at a lower tier causes failure at more distant (e.g., higher) tiers. Further, a thickness (e.g., a z-height) of the interconnects increases the overall thickness of the IC package and limits the number of tiers that may be included in the stack. Various ones of the embodiments disclosed herein may help achieve improved processing and memory performance of IC packages, with reduced thickness, relative to conventional approaches by stacking dies and forming a conductive via in a channel of dielectric material adjacent to the stacked dies that electrically couples the stacked dies.

In the following detailed description, reference is made to the accompanying drawings that form a part hereof, wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. The accompanying drawings are not necessarily drawn to scale. Although many of the drawings illustrate rectilinear structures with flat walls and right-angle corners, this is simply for ease of illustration, and actual devices made using these techniques will exhibit rounded corners, surface roughness, and other features.

Various operations may be described as multiple discrete actions or operations in turn, in a manner that is most helpful in understanding the disclosed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die," an "IC die," "a microelectronic component," and "an electrical component." The terms "top" and "bottom" may be used herein to explain various features of the drawings, but these terms are simply for ease of discussion, and do not imply a desired or required orientation.

The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

As used herein, the term "insulating" means "electrically insulating," unless otherwise specified. Throughout the specification, and in the claims, the term "coupled" means a direct or indirect connection, such as a direct electrical, mechanical, or magnetic connection between the things that are connected or an indirect connection, through one or more passive or active intermediary devices. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

When used to describe a range of dimensions, the phrase "between X and Y" represents a range that includes X and Y. For convenience, the phrase "FIG. 2" may be used to refer to the collection of drawings of FIGS. 2A-2J, the phrase "FIG. 3" may be used to refer to the collection of drawings of FIGS. 3A-3J, etc. Although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

An "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "metal traces," "lines," "metal lines," "wires," "metal wires," "trenches," or "metal trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PIC. In such cases, the term "interconnect" may refer to optical waveguides (e.g., structures that guide and confine light waves), including optical fiber, optical splitters, optical combiners, optical couplers, and optical vias.

FIG. 1A is a side, cross-sectional view of a microelectronic assembly 100, in accordance with various embodiments. The microelectronic assembly 100 may include a base die 103 with a multi-tiered die assembly 104 disposed thereon. In particular, the multi-tiered die assembly 104 may include vertically stacked dies 114 having a trench 135 of dielectric material 133 through the vertically stacked dies 114 and a conductive through dielectric via (TDV) 115. The dielectric material 133 in a trench 135 may include any suitable dielectric material commonly used in semiconductor manufacture, such as silicon and one or more of oxygen, nitrogen, and carbon (e.g., in the form of silicon oxide, silicon nitride, silicon oxynitride, or silicon carbon nitride); a polyimide material; or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). In particular, FIG. 1A is the side, cross-sectional view of FIG. 113 along the A-A' line.

Figure 1B:
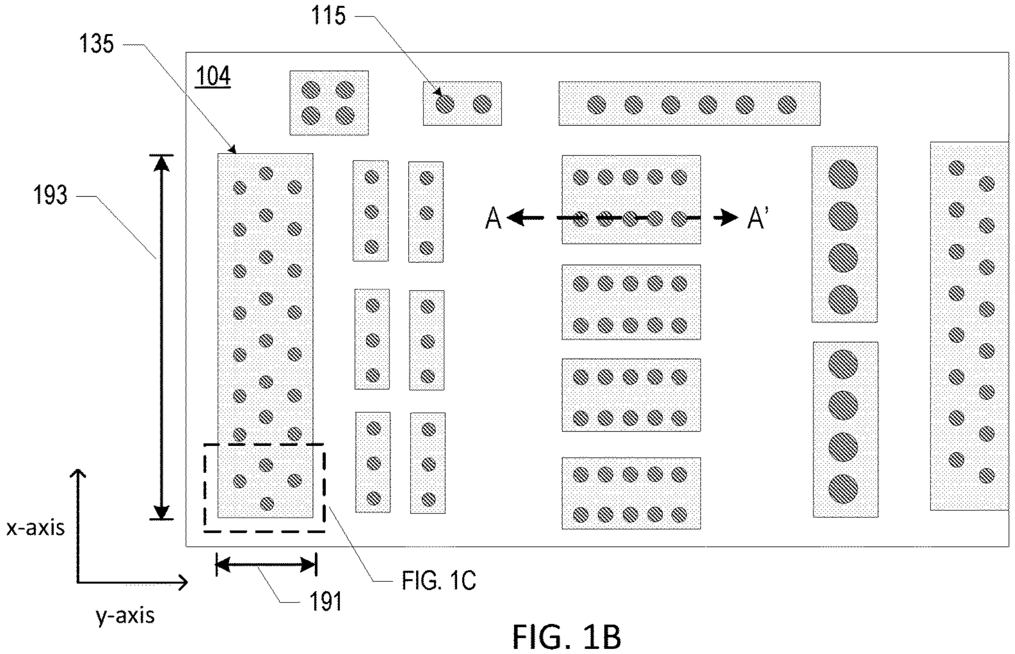
FIG. 1B is a top view of an exemplary assembly, in accordance with various embodiments.

FIG. 113 is a top view of an exemplary microelectronic assembly, in accordance with various embodiments. FIG. 113 illustrates a top view of a multi-tiered die assembly 104 including one or more trenches 135 of a dielectric material 133 and one or more TDVs 115 in the trench 135. A trench 135 may have any suitable shape. For example, a trench 135 may have a rectangular or cuboidal shape, as shown in FIG. 1B, but may also have other shapes, such as cylindrical or conical, etc. A trench 135 may have any suitable dimensions, for example, an individual trench 135 may have a width 191 (e.g., y-dimension) of between 0.5 microns and 200 microns and a length 193 (e.g., x-dimension) of between 0.5 microns and 200 microns. The one or more trenches 135 may have any suitable pattern, arrangement, and configuration within. As shown in FIG. 1B, for example, the trenches 135 may have same size and shape, may have different sizes and shapes, may be arranged symmetrically, may be arranged asymmetrically, may be within an interior portion of the multi-tiered die assembly 104, or may be along an exterior portion (e.g., along a perimeter or edge) of the multi-tiered die assembly 104.

Figure 1C:
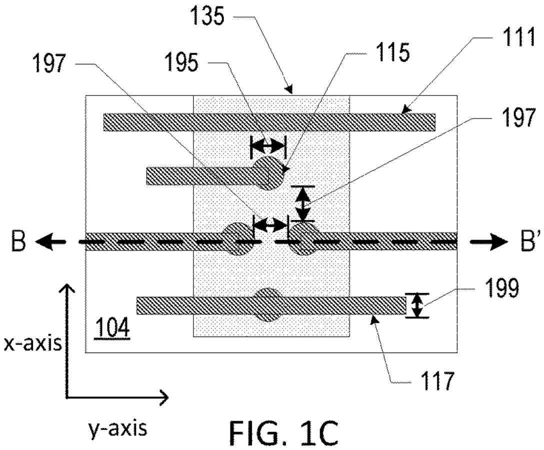
FIG. 1C is a detailed view of a trench with through dielectric vias, in accordance with various embodiments.

FIG. 1C is a magnified view of a portion of FIG. 1B, as indicated by the dotted lines, in accordance with various embodiments. FIG. 1C shows a top view of a trench 135 having four TDVs 115 and conductive pathways (e.g., conductive pathways 117 of FIG. 1A) electrically coupled to the TDVs 115. As shown in FIG. 1C, a TDV 115 (e.g., the top TDV 115) may be electrically coupled to one side of a die 114 by a conductive pathway 117, may be electrically coupled to both sides of a die by a conductive pathway 117 (e.g., the bottom TDV 115), or a first TDV 115 may be electrically coupled to a first side of the die 114 by a first conductive pathway 117 and a second TDV 115 may be electrically coupled to a second side of the die 114 (e.g., the two middle TDVs 115). A trench 135 may further include a conductive pathway 111 (e.g., the top conductive pathway) that is not electrically coupled to a TDV 115. A TDV 115 may have any suitable dimensions. In some embodiments, an individual TDV 115 may have a cross-section or diameter 195 between 40 nanometers and 10 microns (e.g., between 40 nanometers and 0.5 microns, between 0.5 micron and 2.5 microns, between 2 microns and 5 microns, or between 5 microns and 10 microns). The TDVs 115 may have any suitable cross-sectional shape, for example, square, triangular, and oval, among others. The TDVs 115 may have any suitable arrangement. For example, in some embodiments, the TDVs 115 may be spaced apart 197 by between 40 nanometers and 5 microns (e.g., between 40 nanometers and 80 nanometers, between 1 micron and 5 microns, or between 5 microns and 10 microns). In some embodiments, a conductive pathway 111 or conductive pathway 117 may have a length 199 (e.g., x-dimension) of between 40 nanometers and 5 microns.

Figure 1D:
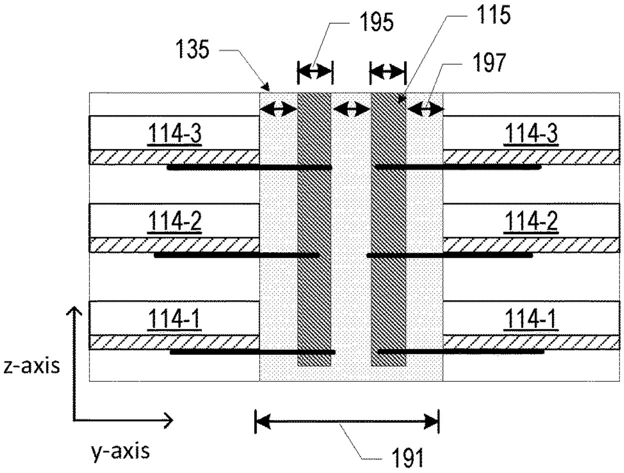
FIG. 1D is a side, cross-sectional view of a portion of FIG. 1C, in accordance with various embodiments.

FIG. 1D is the side, cross-sectional view of FIG. 1C along the B-B' line, in accordance with various embodiments. FIG. 1D shows a portion of a multi-tiered die assembly 104 having three vertically stacked dies 114-1, 114-2, 114-3 and a trench 135 of dielectric material through the stacked dies 114 with two TDVs 115. The trench 135 may have a width 191 (e.g., y-dimension), as described above with reference to FIG. 1B. The TDVs 115 may have a diameter 195 and may be spaced apart 197, as described above with reference to FIG. 1C. Although FIG. 1D illustrates three vertically stacked dies, a stack may include any suitable number of dies.

Figure 1E:
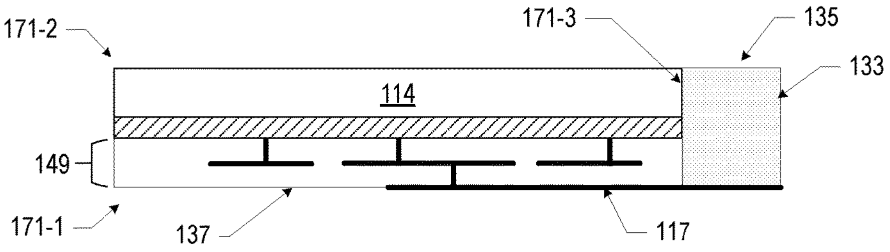
FIG. 1E is a detailed view of an individual stacked die, in accordance with various embodiments.
Figure 6:
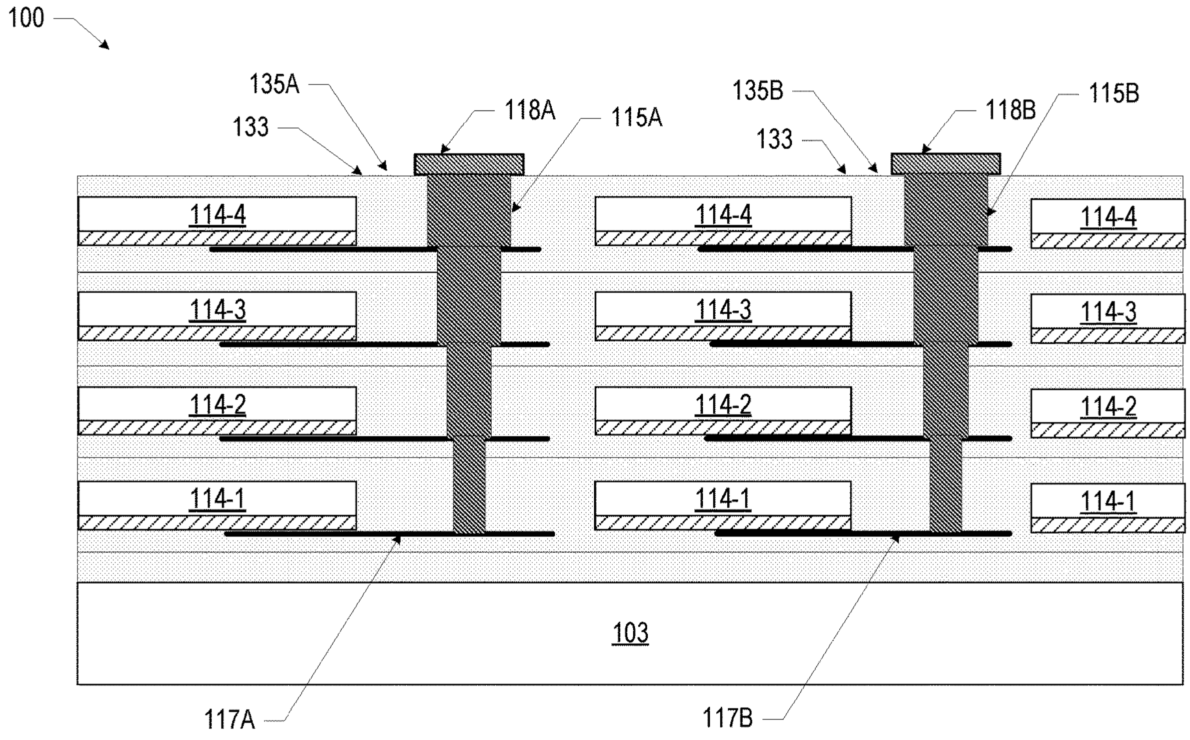
FIG. 6 is a side, cross-sectional view of another exemplary microelectronic assembly, in accordance with various embodiments.

As shown in FIG. 1A, a TDV 115 may electrically couple the individual dies 114 and/or to the base die 103 to each other by conductive pathway 118. In some embodiments, the base die 103 may be a support structure that does not include circuitry and is not electrically coupled to a TDV 115 (e.g., as shown in FIG. 6). In some embodiments, as shown in FIG. 1A, the base die 103 includes logic circuitry and may be electrically coupled to components in the microelectronic assembly (e.g., electrically coupled to a TDV 115 or other conductive pathways (not shown)). As shown in FIG. 1A, the base die 103 may include a bottom surface (e.g., a first surface 172-1) and an opposing top surface (e.g., a second surface 172-2). The base die 103 may further include a conductive pathway 119 on the top surface 172-2. The first tier 104-1 of the multi-tiered die assembly 104 may be attached to the top surface 172-2 of the base die 103. As shown in FIG. 1E, the die 114 may have a bottom surface (e.g., a first surface 171-1), an opposing top surface (e.g., a second surface 171-2), and a side surface 171-3, also referred to herein as a lateral surface, that is substantially perpendicular to the top and bottom surfaces 171-1, 171-2. The lateral surface 171-3 may include an internal lateral surface adjacent to a trench 135 of dielectric material 133 or may include an edge or external lateral surface of the die 114. Further, the bottom surface 171-1 may be referred herein as the "active side" as indicated by the slanted lines, which may include devices and components, such as transistors, capacitors, inductors, resistors, etc. The die 114 may further include a conductive pathway 117 extending laterally from the active surface 171-1 that electrically couples to the TDV 115. In some embodiments, the die 114 may further include a redistribution layer (RDL) 149 at the active surface 171-1. An RDL 149 may include an insulating material 137 (e.g., a dielectric material formed in multiple layers, as known in the art) and one or more conductive pathways through the dielectric material (e.g., including conductive traces and/or conductive vias) coupled to the conductive pathway 117. As shown in FIG. 1A, the die 114 may be at least partially surrounded by the dielectric material 137 (e.g., the dielectric material 137 may be on the bottom surface 171-1 and the top surface 171-2 of the die 114). In some embodiments, the dielectric material 137 may include an oxide-based material (e.g., silicon dioxide, silicon oxynitride, or spin on oxide), or low-k and ultra low-k dielectric (e.g., carbon-doped dielectrics, fluorine-doped dielectrics, porous dielectrics, and organic polymeric dielectrics). In some embodiments, the dielectric material 137 around the die 114 and the dielectric material 137 of the RDL 149 may be a same dielectric material. In some embodiments, the dielectric material 137 around the die 114 and the dielectric material 137 of the RDL 149 may be different dielectric materials. In some embodiments, the dielectric material 133 of the trench 135 may be a different dielectric material than the dielectric material 137 around the die 114 and the dielectric material 137 of the RDL 149. In some embodiments, the dielectric materials 133 and 137 may be a same dielectric material. The TDVs 115 may be bordered by liner materials, such as adhesion liners and/or barrier liners.

The multi-tiered die assembly 104 may include a plurality of tiers or layers (e.g., layers 104-1, 104-2, 104-3, and 104-4). An individual layer of the multi-tiered die assembly 104 may include a die 114 with a trench 135 of dielectric material 133 on a side surface 171-3 and a TDV 115 that electrically couples to a conductive pathway 117 on the die 114. For example, as shown in FIG. 1A, a multi-tiered die assembly 104 may include four vertically stacked layers (e.g., layers 104-1, 104-2, 104-3, and 104-4), each layer including a die 114 (e.g., dies 114-1, 114-2, 114-3, and 114-4, respectively), each individual die 114 having a conductive pathway 117 (e.g., conductive pathways 117-1, 117-2, 117-3, and 117-4, respectively) coupled to an individual TDV 115 (e.g., TDVs 115-1, 115-2, 115-3, and 115-4, respectively) at side surface 171-3 of the die 114. By electrically coupling the TDV 115 directly to a die 114, any connection failures may be limited to the tier having the affected die and/or affected connection while not accumulating and affecting connections in another tier. In some embodiments, the conductive pathway 119 on the base die 103 may be electrically coupled to a TDV 115 (e.g., TDV 115-5). In some embodiments, the multi-tiered die assembly 104 may include a conductive pathway 118 at a top surface electrically coupling the TDVs 115 together. In some embodiments, the multi-tiered die assembly 104 may be attached to the base die 103 by fusion bonding. As used herein, the term "fusion bonding" refers to dielectric-to-dielectric bonding techniques (e.g., techniques in which the dielectric of opposing interfaces are brought into contact, then subject to heat and sometimes compression).

The TDV 115 may be formed of any suitable conductive material, including a metal, such as copper, nickel, molybdenum, ruthenium, cobalt, polysilicon, or tungsten, or a metal alloy thereof. The TDV 115 may have any suitable size and shape, which may depend on the process used to form the TDV 115, as described in more detail below in FIGS. 6-12. The TDVs 115 may span any suitable number of layers. In some embodiments, the TDVs 115 may span four layers, as shown in FIG. 1A. In some embodiments, the TDVs 115 may span two layers, as shown in FIG. 13. In some embodiments, an individual TDV 115 may span more than four layers. In some embodiments, an individual TDV 115 may have an aspect ratio (height:diameter) between 10:1 and 100:1 (e.g., between 25:1 and 75:1). In some embodiments, the TDVs have a pitch between 80 nanometers microns and 10 microns. As used herein, pitch is measured center-to-center (e.g., from a center of a TDV to a center of an adjacent TDV).

The multi-tiered die assembly 104 may have any suitable dimensions. For example, in some embodiments, a thickness (e.g., z-dimension or height) of the multi-tiered die assembly 104 may be between 1 micron (um) and 1000 um. Although a multi-tiered die assembly 104 having four layers is illustrated in FIG. 1A, a multi-tiered die assembly 104 may include any suitable number of layers, any suitable number of dies, and any suitable die arrangement. For example, a multi-tiered die assembly 104 may include between 2 and 128 vertically stacked dies. In some embodiments, a multi-tiered die assembly 104 may include between 2 and 32 vertically stacked dies. In some embodiments, a multi-tiered die assembly 104 may include between 2 and 16 vertically stacked dies (e.g., SRAM) and may have a thickness of less than or equal to 4 um. In some embodiments, a multi-tiered die assembly 104 may include between 32 and 128 vertically stacked dies (e.g., DRAM), may have a thickness less than or equal to 700 um, and may have an area between 50 millimeters squared ($mm^2$) and 200 $mm^2$.

The die 114 and base die 103 disclosed herein may include an insulating material (e.g., the insulating material formed in multiple layers, as known in the art) and multiple conductive pathways formed through the insulating material. In some embodiments, the insulating material of a die may include a dielectric material commonly used in semiconductor manufacture, such as silicon and one or more of oxygen, nitrogen, and carbon (e.g., in the form of silicon oxide, silicon nitride, silicon oxynitride, or silicon carbon nitride); a polyimide material; or a low-k or ultra low-k dielectric (e.g., carbon-doped dielectrics, fluorine-doped dielectrics, porous dielectrics, organic polymeric dielectrics, photo-imageable dielectrics, and/or benzocyclobutene-based polymers). The conductive pathways in a die may include conductive traces and/or conductive vias, and may connect any of the conductive contacts in the die in any suitable manner (e.g., connecting multiple conductive contacts on a same surface or on different surfaces of the die). Example structures that may be included in the dies disclosed herein are discussed below with reference to FIG. 16. The conductive pathways in the die may be bordered by liner materials, such as adhesion liners and/or barrier liners, as suitable.

In some embodiments, the microelectronic assembly 100 may include redistribution layers (RDLs) (not shown) between one or more of the layers of the multi-tiered die assembly 104 and/or between the multi-tiered die assembly 104 and the base die 103. An RDL may include an insulating material (e.g., a dielectric material formed in multiple layers, as known in the art) and one or more conductive pathways through the dielectric material (e.g., including conductive traces and/or conductive vias).

Although a single multi-tiered die assembly 104 and a single base die 103 is illustrated in FIG. 1A, this is simply an example, and the microelectronic assembly 100 may include any number of multi-tiered die assemblies 104 and any number of base dies 103. In some embodiments, the multi-tiered die assembly 104 may not be attached to a base die 103, but instead may be attached to an interposer or a substrate. The dies 103, 114 may perform any suitable functionality, and may include processing devices, memory, communications devices, sensors, or any other computing components or circuitry. For example, the base die 103 may include a controller die with logic elements (e.g., logic circuitry) and the dies 114 may include memory, such as SRAM, DRAM, or MRAM. In another example, the base die 103 may include a central processing unit (CPU), a platform controller hub (PCH), a graphic processing unit (GPU), a field programmable gate array (FPGA), a system-on-a-chip (SoC) die, or an input/output (I/O) hub die and the dies 114 may include SRAM, DRAM, or MRAM.

The microelectronic assembly 100 may further include a package substrate 102. The package substrate 102 may have a bottom surface (e.g., a first surface 170-1) and an opposing top surface (e.g., a second surface 170-2). The base die 103 may be electrically coupled to the package substrate 102 by first level interconnects 120. The first level interconnects 120 may be surrounded by an underfill material 160 (e.g., the underfill material 160 may be disposed between the base die 103 and the second surface 170-2 of the package substrate 102). The package substrate 102 may have first conductive contacts 134 on the first surface 170-1 and second conductive contacts 122 on the second surface 170-2. The base die 103 may have conductive contacts 124. The conductive contacts 124 on the base die 103 may be coupled to the conductive contacts 122 on the second surface 170-2 of the package substrate 102 via the first level interconnects 120. In some embodiments, the first level interconnects 120 may include solder bumps (as illustrated in FIG. 1A) or copper pillar in flip chip technology; in other embodiments, the first level interconnects 120 may include wires for wire bond technology, or any other suitable interconnects surrounded by an underfill material 160.

The underfill material 160 may be any suitable material. The underfill material 160 may be an insulating material, such as an appropriate epoxy material. In some embodiments, the underfill material 160 may include a capillary underfill, a thermal interface material (TIM), non-conductive film (NCF), or molded underfill. The underfill material 160 may be selected to have a CTE that may mitigate or minimize the stress between the base die 103 and the package substrate 102. In some embodiments, the underfill material 160 may include an epoxy flux that assists with soldering the base die 103 to the package substrate 102 when forming the first level interconnects 120, and then polymerizes and encapsulates the first level interconnects 120. In some embodiments, the CTE of the underfill material 160 may have a value that is intermediate to the CTE of the package substrate 102 (e.g., the CTE of the dielectric material of the package substrate 102) and a CTE of the base die 103. The underfill material 160 may be dispensed using any suitable process, such as capillary underfill process or molded underfill process.

The package substrate 102 may include an insulating material (e.g., a dielectric material formed in multiple layers, as known in the art) and one or more conductive pathways (not shown) to route power, ground, and signals through the dielectric material (e.g., including conductive traces and/or conductive vias, as shown). In some embodiments, the insulating material of the package substrate 102 may be a dielectric material, such as an organic dielectric material, a fire retardant grade 4 material (FR-4), BT resin, polyimide materials, glass reinforced epoxy matrix materials, organic dielectrics with inorganic fillers or low-k and ultra low-k dielectric (e.g., carbon-doped dielectrics, fluorine-doped dielectrics, porous dielectrics, and organic polymeric dielectrics). In particular, when the package substrate 102 is formed using standard PCB processes, the package substrate 102 may include FR-4, and the conductive pathways in the package substrate 102 may be formed by patterned sheets of copper separated by build-up layers of the FR-4. The conductive pathways in the package substrate 102 may be bordered by liner materials, such as adhesion liners and/or barrier liners, as suitable. In some embodiments, the package substrate 102 may be a coreless substrate, a UTC substrate, a wafer level packaging, or any other suitable package designed to minimize z-height, as is known in the art. The package substrate 102 may include conductive pathways (not shown) that allow power, ground, and other electrical signals to move between the base die 103 and the package substrate 102. In some embodiments, the base die 103 may not be coupled to a package substrate 102, but may instead be coupled to an interposer, an other substrate, or a circuit board, such as a PCB.

In some embodiments, the package substrate 102 may be formed using a lithographically defined via packaging process. In some embodiments, the package substrate 102 may be manufactured using standard organic package manufacturing processes, and thus the package substrate 102 may take the form of an organic package. In some embodiments, the package substrate 102 may be a set of redistribution layers formed on a panel carrier by laminating or spinning on a dielectric material, and creating conductive vias and lines by laser drilling or ablation and plating. In some embodiments, the package substrate 102 may be formed on a removable carrier using any suitable technique, such as a redistribution layer technique. Any method known in the art for fabrication of the package substrate 102 may be used, and for the sake of brevity, such methods will not be discussed in further detail herein.

In some embodiments, the package substrate 102 may be a lower density medium and the base die 103 and the die 114 may be a higher density medium or have an area with a higher density medium. As used herein, the term "lower density" and "higher density" are relative terms indicating that the conductive pathways (e.g., including conductive interconnects, conductive lines, and conductive vias) in a lower density medium are larger and/or have a greater pitch than the conductive pathways in a higher density medium. In some embodiments, a higher density medium may be manufactured using a modified semi-additive process or a semi-additive build-up process with advanced lithography (with small vertical interconnect features formed by advanced laser or lithography processes), while a lower density medium may be a PCB manufactured using a standard PCB process (e.g., a standard subtractive process using etch chemistry to remove areas of unwanted metal, such as copper, and with coarse vertical interconnect features formed by a standard laser process). In other embodiments, the higher density medium may be manufactured using semiconductor fabrication process, such as a single damascene process or a dual damascene process.

The microelectronic assembly 100 may further include a circuit board 131. The first conductive contacts 134 on the first surface 170-1 of the package substrate 102 may be coupled to conductive contacts 132 on a surface of the circuit board 131 via second level interconnects 130. The second level interconnects 130 may be surrounded by an underfill material 160. In some embodiments, the second level interconnects 130 may include solder balls (as illustrated in FIG. 1A) for a ball grid array (BGA) coupling; in other embodiments, the second level interconnects 130 may include solder paste contacts to provide land grid array (LGA) interconnects, or any other suitable interconnect. In some embodiments, the circuit board 131 may include one or more components disposed thereon (not shown). The circuit board 131 may include conductive pathways that allow power, ground, and other electrical signals to move between the circuit board 131 and the package substrate 102 as well as between the circuit board 131 and the base die 103, as known in the art.

Although FIG. 1A illustrates a single IC package (e.g., package substrate 102 with a multi-tiered die assembly 104 on a base die 103) disposed on the circuit board 131, this is simply for ease of illustration and multiple IC packages with multiple dies may be disposed on the circuit board 131. In some embodiments, the circuit board 131 may be a PCB (e.g., a motherboard). In some embodiments, the circuit board 131 may be another IC package, and the microelectronic assembly 100 may be a package-on-package structure. In some embodiments, the circuit board 131 may be an interposer, and the microelectronic assembly 100 may be a package-on-interposer structure.

Many of the elements of the microelectronic assembly 100 of FIG. 1A are included in other ones of the accompanying figures; the discussion of these elements is not repeated when discussing these figures, and any of these elements may take any of the forms disclosed herein. Some of the elements of the microelectronic assembly 100 of FIG. 1A are not included in other ones of the accompanying figures for simplicity, but a microelectronic assembly 100 may include these omitted elements. In some embodiments, individual ones of the microelectronic assemblies 100 disclosed herein may serve as a system-in-package (SiP) in which multiple dies 114 having different functionality are included. In such embodiments, the microelectronic assembly 100 may be referred to as an SiP.

Any suitable techniques may be used to manufacture the microelectronic assemblies 100 disclosed herein. For example, FIGS. 2A-2J are side, cross-sectional views of various stages in an example process for manufacturing the microelectronic assembly 100 of FIG. 1A, in accordance with various embodiments. Although the operations discussed below with reference to FIGS. 2A-2J (and others of the accompanying drawings representing manufacturing processes) are illustrated in a particular order, these operations may be performed in any suitable order. Further, additional operations which are not illustrated may also be performed without departing from the scope of the present disclosure. Also, various ones of the operations discussed herein with respect to FIGS. 2A-2J may be modified in accordance with the present disclosure to fabricate others of microelectronic assembly 100 disclosed herein.

FIGS. 2A-2H illustrate an example process for creating a trench 135 having a dielectric material in a multi-tiered die assembly 104 of vertically stacked dies 114. FIGS. 2I-2J illustrate an example process for forming via openings and depositing a conductive material to create TDVs 115 through the trench 135. Although FIGS. 2A-2J illustrate a process at a die level, the process may be performed at a wafer level and then undergo a singulation process to form individual dies. Further, although FIGS. 2A-2J illustrate the formation of a single trench, the process may be performed to form multiple trenches. As shown in FIGS. 2A-2J, in each layer of the multi-tiered die assembly 104, a trench may be formed through the material of a die 114, the trench and a top surface of the die 114 may be filled with a dielectric material 133, after all layers are stacked, via openings may be formed through the dielectric material in the trench, and filled with a conductive material to form the TDVs 115, which allows for a single etch process and a single conductive fill process for electrically coupling the dies 114 in each layer of the multi-tiered die assembly 104. By forming trenches and filling with a dielectric material, a connectivity region of TDVs 115 through a dielectric material may be created. As the connectivity region includes only a dielectric material, a high aspect ratio drilling process may be employed to form via openings. The etching process is simplified by eliminating the need for different etching processes; a first process to remove the material of the dies 114 and a second process to remove the dielectric material 133. A less complicated etching process may enable better and more consistent electrical contact with the conductive metal without the need for a dielectric liner and may prevent the conductive metal from shorting to silicon. By creating a connectivity region, the TDVs 115 may be formed having a lithographically large structure with a relaxed aspect ratio. Further, by enabling a less complicated etching process very small and high yield vertical connections may be formed that are not possible with other die stacking and bonding techniques. The small and high yield vertical connections improve bandwidth, lower latency, and reduce power due to decreased interconnect length, which results in significantly higher performance, lower cost, and/or higher volumetric density.

Figure 2A:
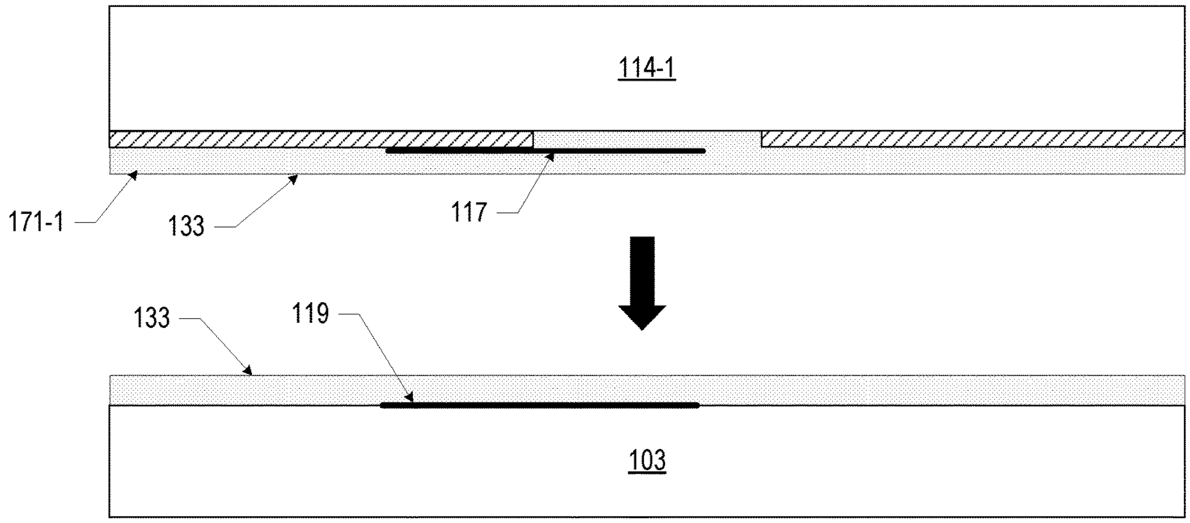
FIGS. 2A-2J are side, cross-sectional views of an exemplary process for manufacturing a microelectronic assembly, in accordance with various embodiments.

FIG. 2A illustrates a die 114-1 including an active surface 171-1 and a conductive pathway 117 in a dielectric material 133 and a base die 103 including a conductive pathway 119 in a dielectric material 133. The die 114-1 is positioned with the active surface 171-1 facing towards the conductive pathway 119 on the surface of the base die 103. The die 114-1 and the base die 103 may include a semiconductor die or a support substrate. In some embodiments, a carrier may be used instead of a base die 103.

Figure 2B:
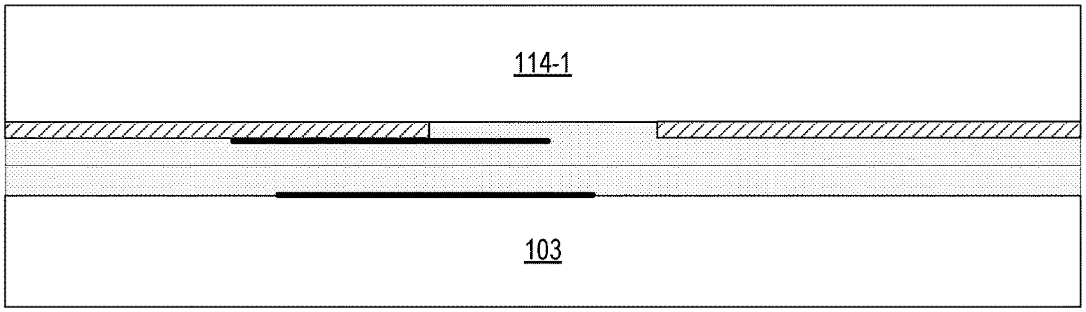

FIG. 2B illustrates an assembly subsequent to attaching the active surface 171-1 of the die 114-1 to the surface of the base die 103. The die 114-1 may be attached to the base die 103 using any suitable technique, including fusion bonding. In some embodiments, the surfaces of the base die 103 and the die 114-1 may undergo additional operations before bonding, such as planarization using chemical mechanical polishing (CMP) and/or plasma activation.

Figure 2C:
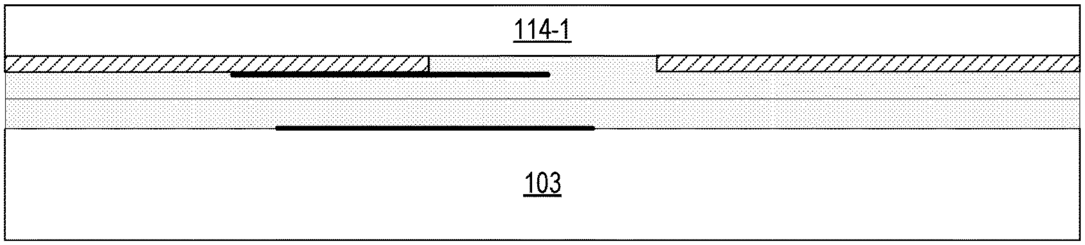

FIG. 2C illustrates an assembly subsequent to removing material from the top surface of the die 114-1 to thin the die 114-1. The material, which is an inactive portion of the die 114-1, may include silicon, germanium, indium antimonide, lead telluride, indium arsenide, indium phosphide, gallium arsenide, gallium antimonide, further materials classified as group III-V, or an insulating material, such as silicon dioxide (glass), ceramic, or quartz, among other materials. The material may be removed using any suitable technique, including, for example, grinding, etching, such as chemical etching.

Figure 2D:
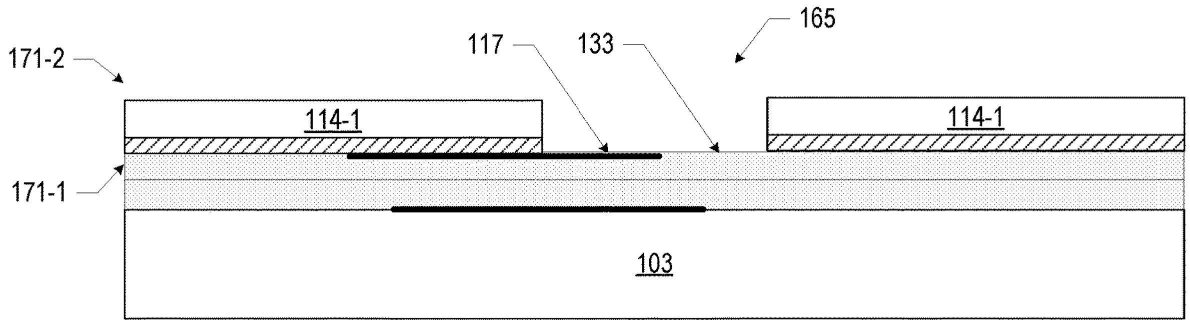

FIG. 2D illustrates an assembly subsequent to forming an opening 165 through the material of the die 114-1. The opening 165 may be formed by removing the material of the die 114-1 and exposing the conductive pathway 117 and the dielectric material 133 on a bottom surface 171-1 of the die 114-1. The material of the die 114-1 may be removed using any suitable technique, including, for example, grinding, etching, such as chemical etching. The opening 165 may have any suitable dimensions for creating a connectivity region and may depend on a number and a size of the TDVs 115 to be formed.

Figure 2E:
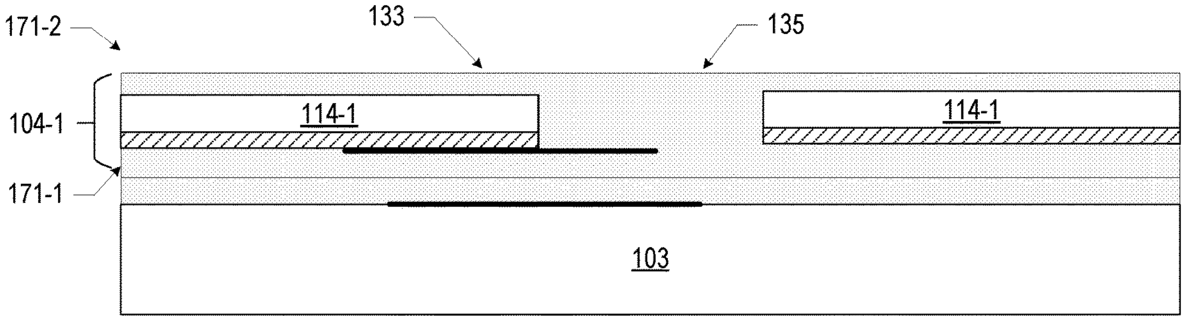

FIG. 2E illustrates an assembly subsequent to depositing the dielectric material 133 in the opening 165 to form a trench 135 and on and around the die 114-1 to form a first layer 104-1. The dielectric material 133 may be formed using any suitable process, including chemical vapor deposition (CVD) or a spin-on-glass process. A thickness of the dielectric material 133 on the die 114-1 may depend on a desired overall thickness of the multi-tiered die assembly 104 and/or on whether an RDL will be deposited between the layers.

Figure 2F:
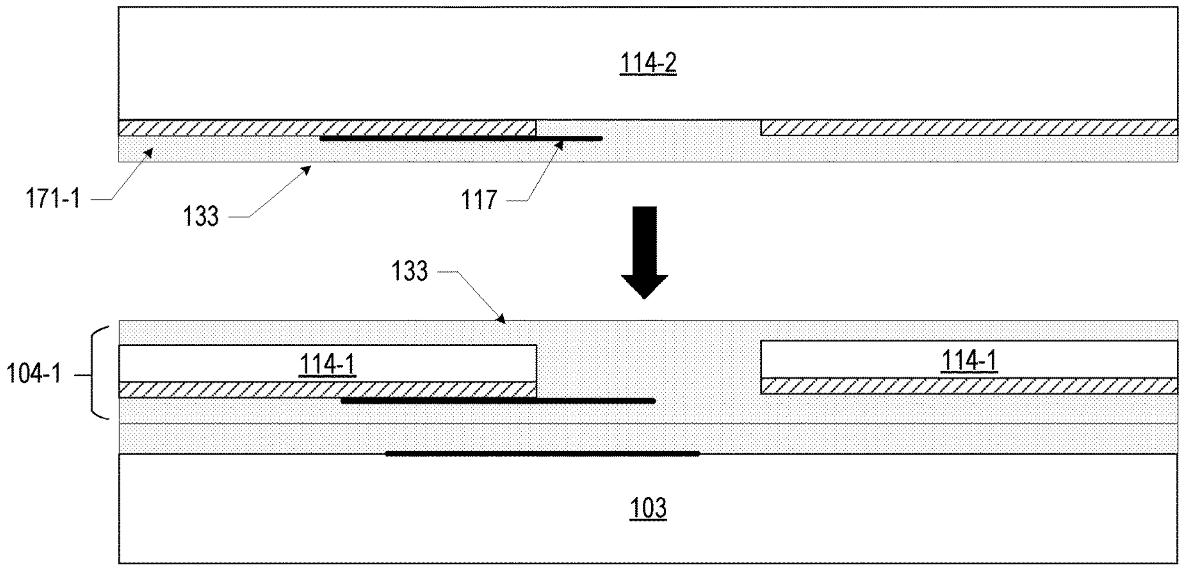

FIG. 2F illustrates a die 114-2 including an active surface 171-1 and a conductive pathway 117 in a dielectric material 133 aligned with the assembly of FIG. 2E. The die 114-2 is positioned with the active surface 171-1 facing towards a top surface of the assembly of FIG. 2E (e.g., the first layer 104-1).

Figure 2G:
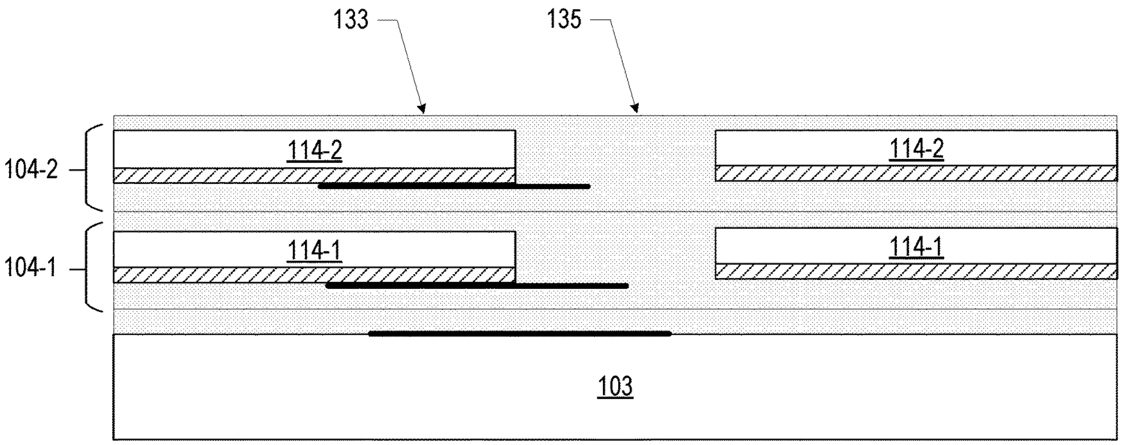

FIG. 2G illustrates an assembly subsequent to forming a second layer 104-2 by attaching (e.g., as described in FIG. 2B) the active surface 171-1 of the die 114-2 to the top surface of the assembly of FIG. 2E and performing the operations as described in FIGS. 2C-2E (e.g., removing material from the top surface of the die 114-2 to thin the die 114-2, forming an opening 165 through the material of the die 114-2, and depositing the dielectric material 133 in the opening 165 to form the trench 135 and on and around the die 114-2).

Figure 2H:
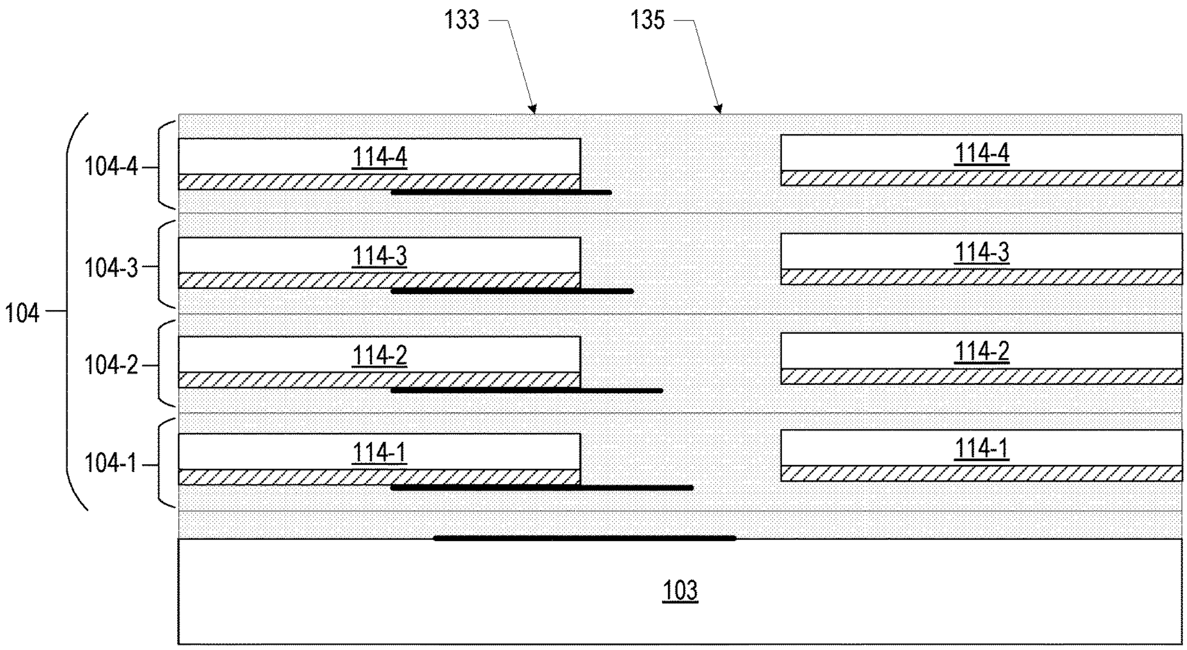
Figure 2I:
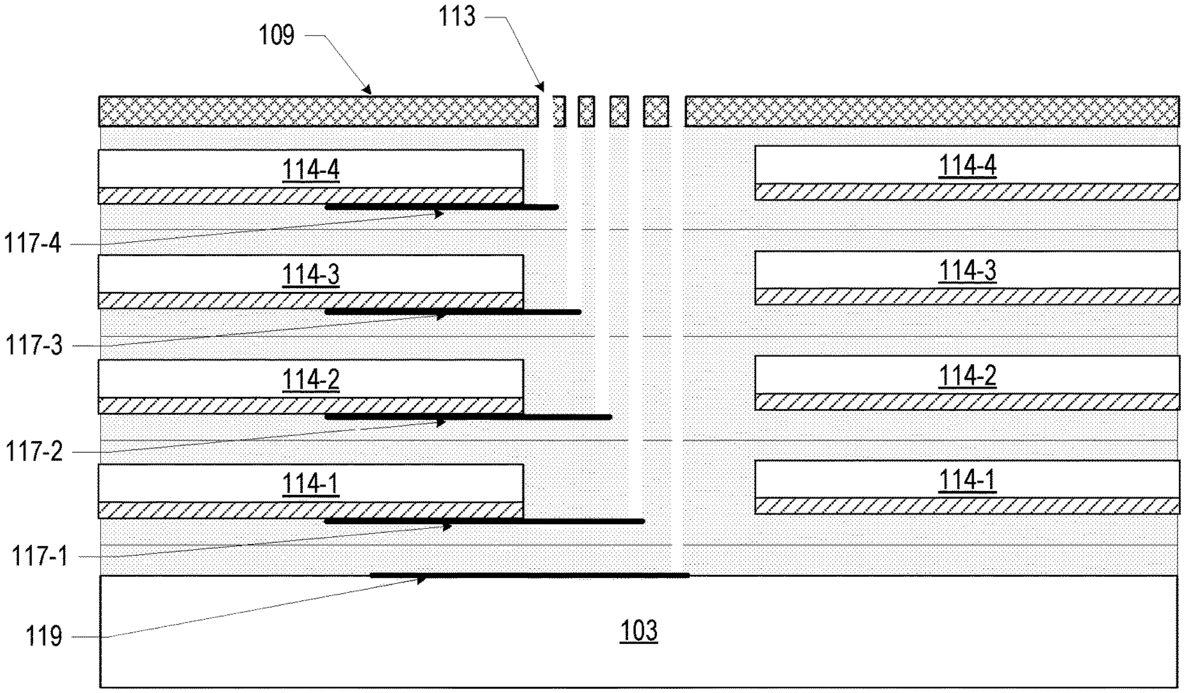
Figure 2J:
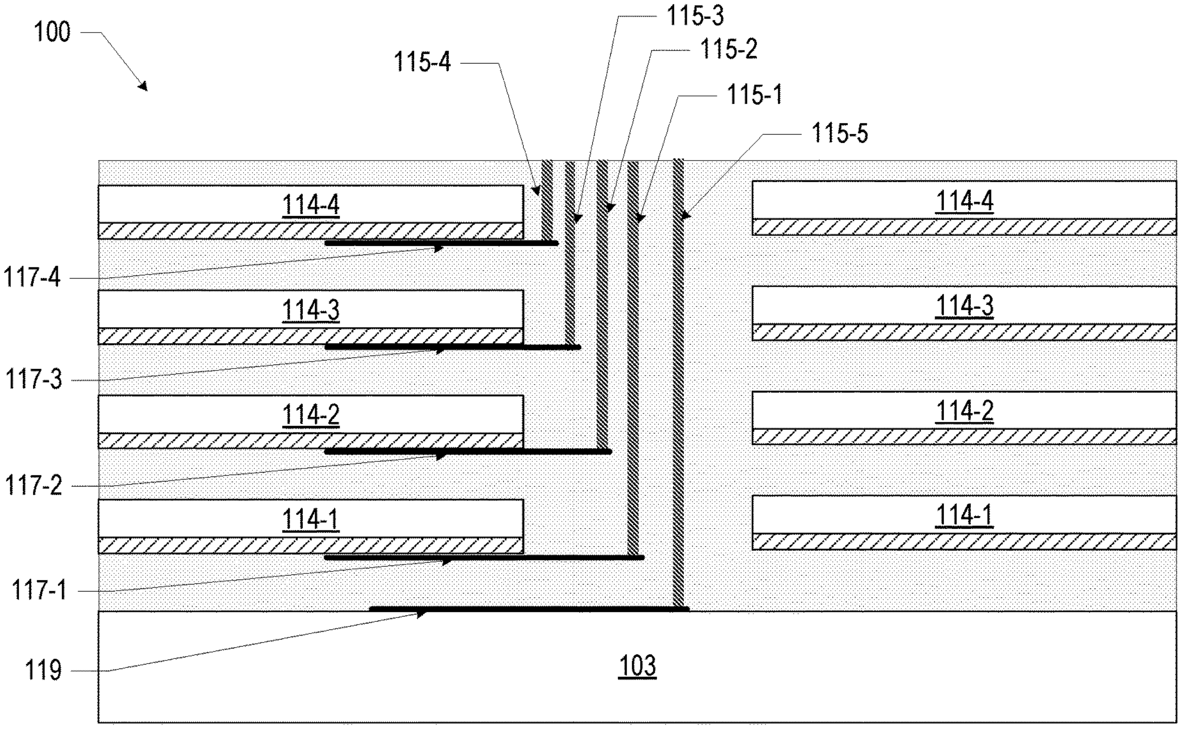

FIG. 2H illustrates an assembly subsequent to forming third and fourth layers 104-3, 104-4 of the multi-tiered die assembly 104 by performing the operations as described above in FIG. 2G for forming layer 104-2.

FIG. 2I illustrates an assembly subsequent to depositing a masking material 109 on a top surface of the assembly of FIG. 2H and forming via openings 113 through the dielectric material 133 to the respective conductive pathways 117-1, 117-2, 117-3, 117-4, 119. The via openings 113 may be formed using any suitable technique, including a selective dielectric material etch (e.g., a high aspect ratio etch) that stops at the metal material of the conductive pathways 117, 119.

FIG. 2J illustrates an assembly subsequent to removing the mask material 109 and depositing a conductive material, such as copper, nickel, molybdenum, ruthenium, cobalt, polysilicon, or tungsten, in the via openings 113 to form the conductive TDVs 115 (e.g., the TDVs 115-1, 115-2, 115-3, 115-4, 115-5). The conductive material may be deposited using any suitable process, such as electroplating, ALD, sputtering, or electroless plating. In some embodiments, the via openings 113 may undergo a cleaning process prior to depositing the conductive material. If multiple assemblies are manufactured together, the assemblies may be singulated. Further manufacturing operations may be performed on the microelectronic assembly 100 of FIG. 2J to form other microelectronic assemblies 100. For example, the assembly of FIG. 2J may undergo a finishing process and/or a metallization or RDL process on a top surface of the assembly to electrically couple the TDVs 115 together (e.g., form the conductive pathway 118 of FIG. 1A). In another example, a bottom surface of the base die 103 of the assembly of FIG. 2J may be electrically coupled to a package substrate 102 by first level interconnects 120 and the package substrate 102 may be electrically coupled to a circuit board 131 by second level interconnects 130 to form the microelectronic assembly 100 of FIG. 1A.

FIGS. 3A-3J are side, cross-sectional views of various stages in an example process for manufacturing a portion of a microelectronic assembly, in accordance with various embodiments. In particular, FIGS. 3A-3J illustrate another example process for creating a trench having a dielectric material in a multi-tiered die assembly 104 of vertically stacked dies 114.

Figure 3A:
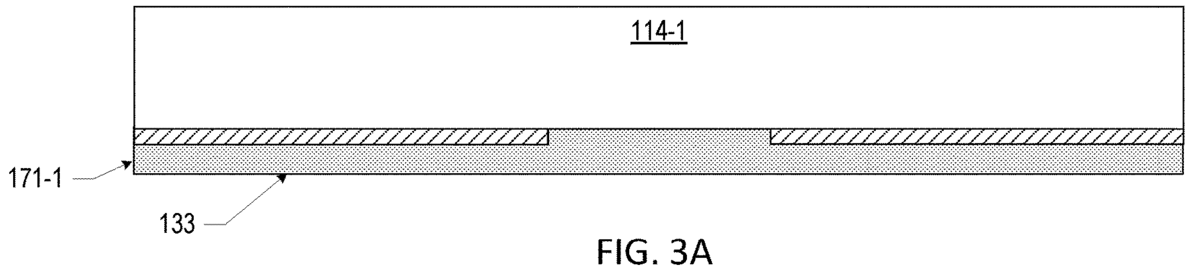
FIGS. 3A-3J are side, cross-sectional views of another exemplary process for manufacturing a microelectronic assembly, in accordance with various embodiments.

FIG. 3A illustrates a die 114-1 including a dielectric material 133 on an active surface 171-1. The wafer 314-1 may include a semiconductor wafer.

Figure 3B:
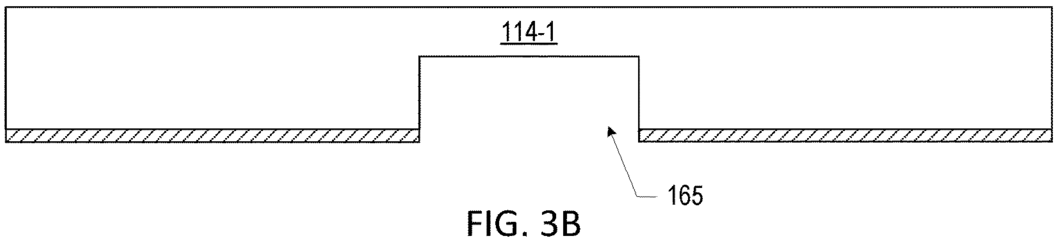

FIG. 3B illustrates the die 114-1 subsequent to removing the dielectric material 133 and to forming an opening 165 by removing the material of the die 114-1. The dielectric material 133 and the material of the die 114-1 may be removed using any suitable technique, including, for example, grinding, etching, such as chemical etching. The opening 165 may have any suitable dimensions for creating a connectivity region and may depend on a number and a size of the TDVs 115 to be formed.

Figure 3C:
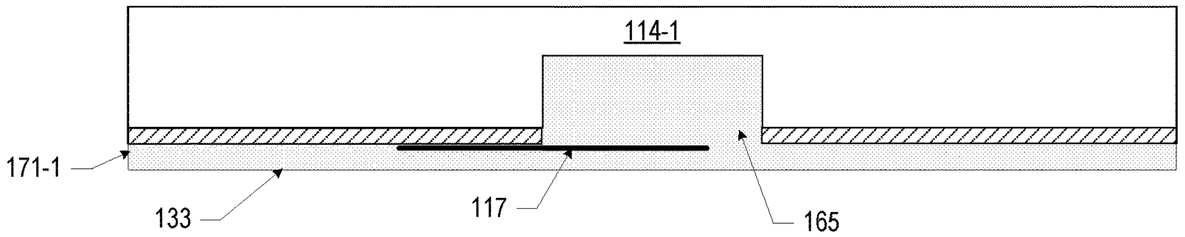

FIG. 3C illustrates the die 114-1 subsequent to depositing the dielectric material 133 in the opening 165 and forming conductive pathway 117 at the active surface 171-1. The dielectric material may be deposited using any suitable technique, including as described above with reference to FIG. 2. The conductive pathway 117 may be formed using any suitable technique, including ALD or plating.

Figure 3D:
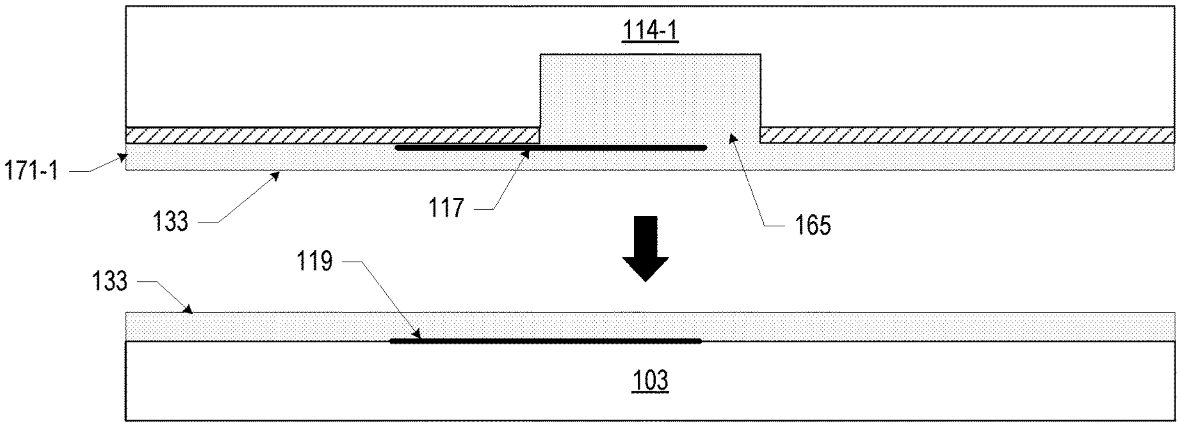

FIG. 3D illustrates the die 114-1 of FIG. 3C aligned with a base die 103 including a conductive pathway 119 in a dielectric material 133. The die 114-1 is positioned with the active surface 171-1 facing towards the conductive pathway 119 on the surface of the base die 103. The base die 103 may include a semiconductor die. In some embodiments, a carrier or support structure may be used instead of a base die 103.

Figure 3E:
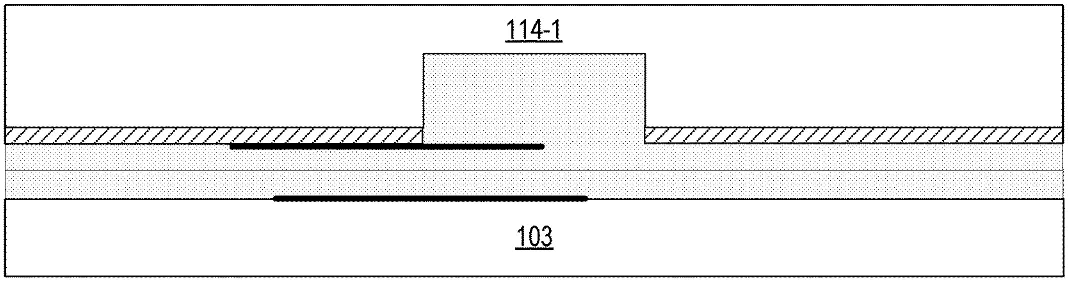

FIG. 3E illustrates an assembly subsequent to attaching the active surface 171-1 of the die 114-1 to the surface of the base die 103. The die 114-1 may be attached to the base die 103 using any suitable technique, including as described above with reference to FIG. 2.

Figure 3F:
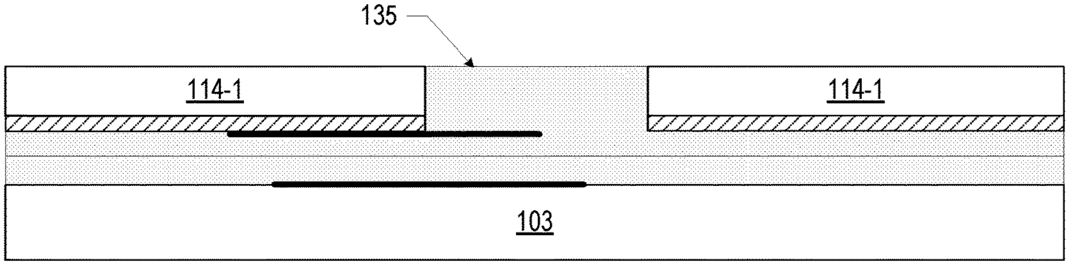

FIG. 3F illustrates an assembly subsequent to removing material from the top surface of the die 114-1 to expose the trench 135. The material, which is an inactive portion of the die 114-1, may be removed using any suitable technique, including, for example, grinding, etching, such as chemical etching. In some embodiments, a portion of the dielectric material 133 may be removed with the material of the die 114-1.

Figure 3G:
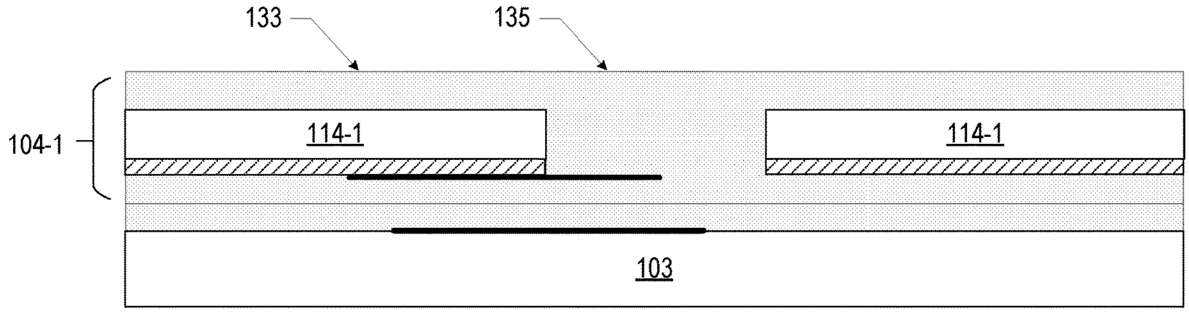

FIG. 3G illustrates an assembly subsequent to depositing the dielectric material 133 on the die 114-1 and on the dielectric material 133 in the trench 165 to form a first layer 104-1. The dielectric material 133 may be formed using any suitable process and having any suitable dimensions, including, as described above with reference to FIG. 2.

Figure 3H:
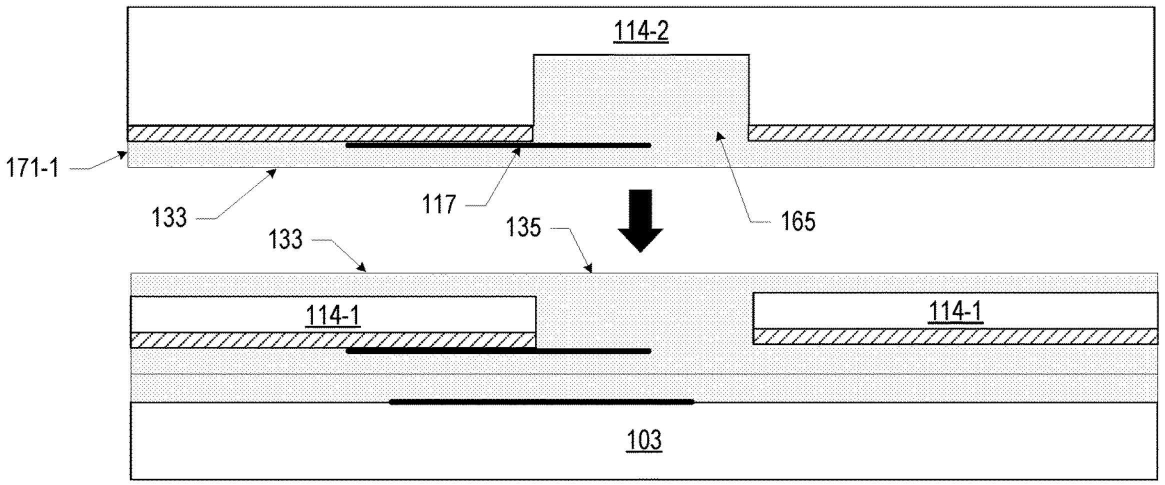

FIG. 3H illustrates a die 114-2 including an active surface 171-1 with a conductive pathway 117 in a dielectric material 133 and an opening 165 with a dielectric material 133 aligned with the trench 135 of the assembly of FIG. 3G. The die 114-2 may be formed using the operations described above in FIGS. 3A-3C with reference to forming the die 114-1. The die 114-2 is positioned with the active surface 171-1 facing towards a top surface of the assembly of FIG. 3G (e.g., the first layer 104-1).

Figure 3I:
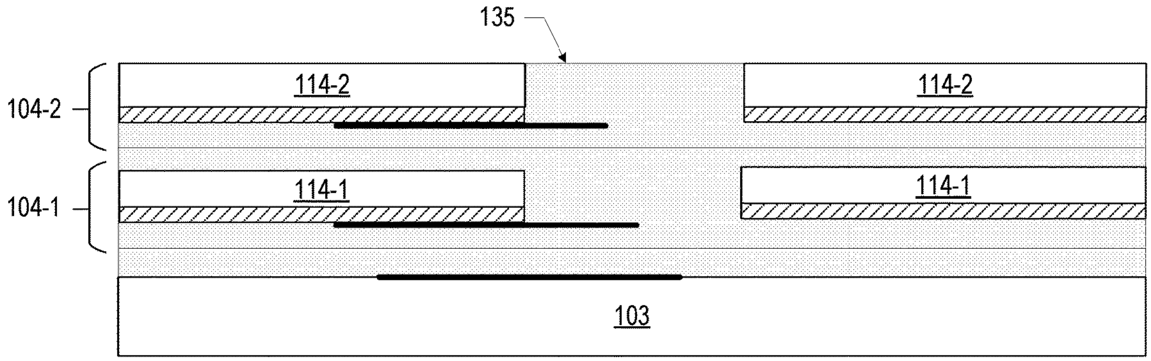

FIG. 3I illustrates an assembly subsequent to forming a second layer 104-2 by performing the operations as described in FIGS. 3F-3G (e.g., removing material from the top surface of the die 114-2 and depositing the dielectric material 133 on the die 114-2 and on the dielectric material 133 in the trench 135).

Figure 3J:
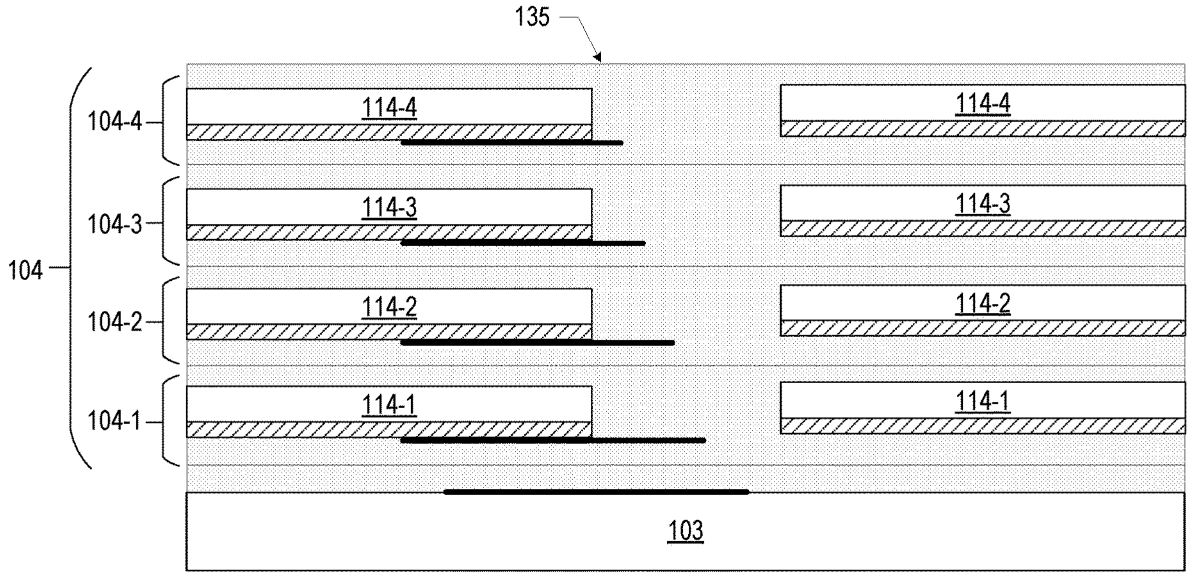

FIG. 3J illustrates an assembly subsequent to forming third and fourth layers 104-3, 104-4 of the multi-tiered die assembly 104 by performing the operations as described above in FIGS. 3H-3I for forming layer 104-2. Further operations may be performed on the assembly of FIG. 3J including, for example, adding additional layers, and/or forming TDVs 115 as described above with reference to FIGS. 2I-2J.

FIGS. 4A-4D are side, cross-sectional views of various stages in an example process for manufacturing a portion of a microelectronic assembly, in accordance with various embodiments. In particular, FIGS. 4A-4D illustrate another example process for creating a die 114 having a trench 135 with a dielectric material 133 similar to the die 114-1 of FIG. 3C.

Figure 4A:
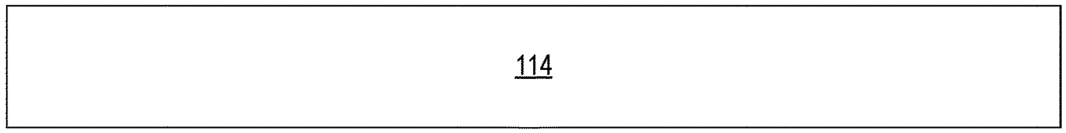
FIGS. 4A-4D are side, cross-sectional views of yet another exemplary process for manufacturing a microelectronic assembly, in accordance with various embodiments.

FIG. 4A illustrates a die 114, which may include a semiconductor die.

Figure 4B:
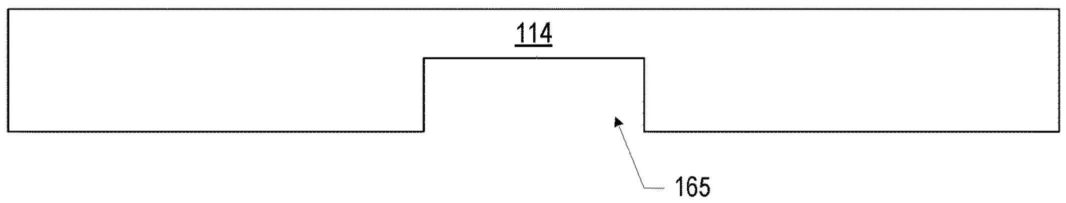

FIG. 4B illustrates the die 114 subsequent to forming an opening 165 by removing the material of the die 114. The material may be removed using any suitable technique, including as described above with reference to FIG. 3.

Figure 4C:
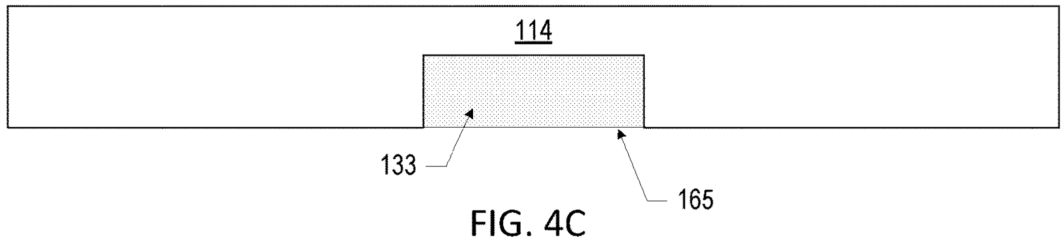

FIG. 4C illustrates the die 114 subsequent to depositing a dielectric material 133 in the opening 165. The dielectric material may be deposited using any suitable technique, including as described above with reference to FIG. 2.

Figure 4D:
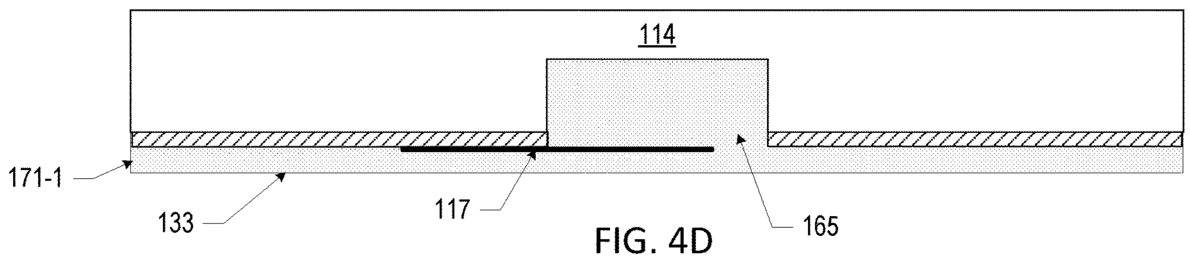

FIG. 4D illustrates the die 114 subsequent to forming the active surface 171-1 and a conductive pathway 117 in a dielectric material 133 on the active surface 171-1. The active surface 171-1 and conductive pathway 117 may be formed using any suitable technique, including ALD or plating. Further operations may be performed on the die 114 of FIG. 4D, including, for example, adding additional layers, as described above with reference to FIGS. 3D-3J, and forming TDVs 115, as described above with reference to FIGS. 2I-2J.

Figure 5A:
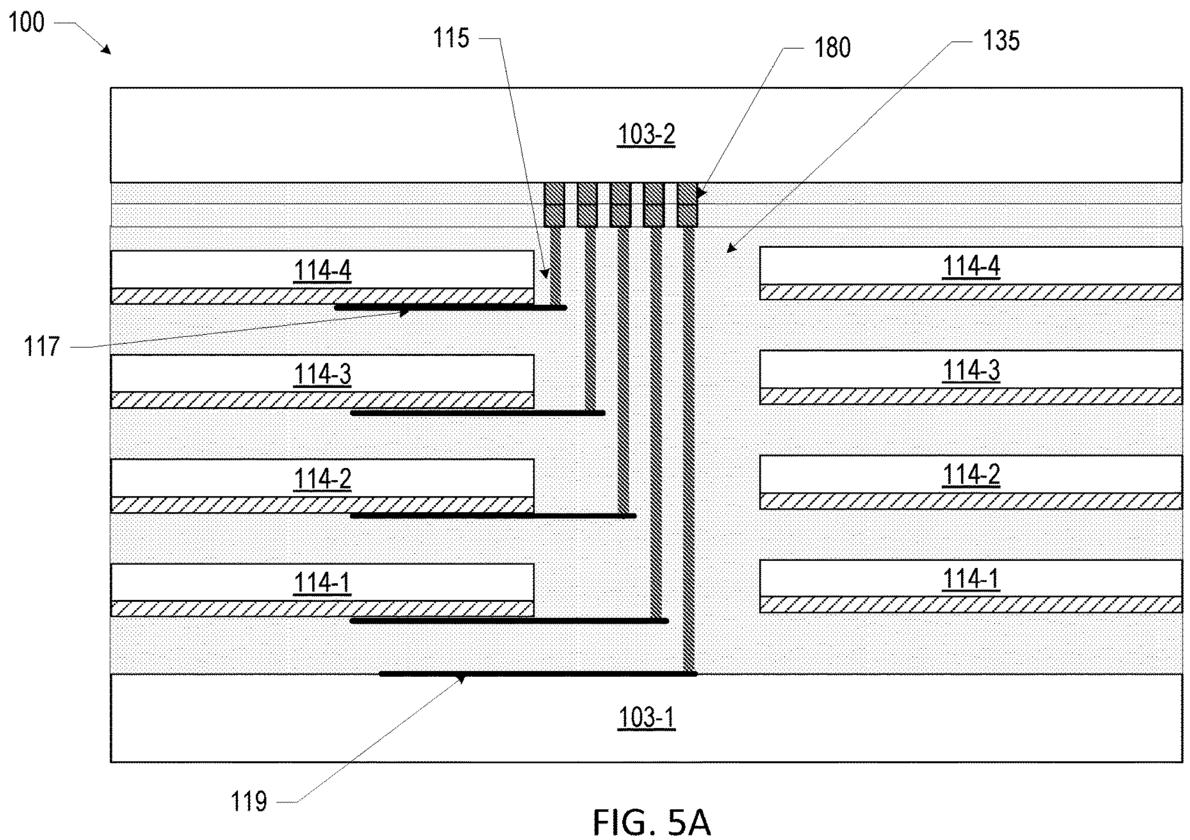
FIGS. 5A-5D are side, cross-sectional views of exemplary microelectronic assemblies, in accordance with various embodiments.

FIG. 5A is a side, cross-sectional view of another example microelectronic assembly 100, in accordance with various embodiments. The microelectronic assembly 100 may include a first base die 103-1 with a multi-tiered die assembly 104 having vertically stacked dies 114 and TDVs 115 through a trench 135 of dielectric material 133 through the dies 114, the TDVs 115 are electrically coupled the dies 114 and the first base die 103-1 at one end and electrically coupled by direct bonding interconnects 180 to a second base die 103-2 at an opposing end. For example, as shown in FIG. 5A, a multi-tiered die assembly 104 may include four vertically stacked layers including a die 114 (e.g., dies 114-1, 114-2, 114-3, and 114-4, respectively) on a first base die 103-1, the base die 103-1 having a conductive pathway 119 and each individual die 114 having a conductive pathway 117 where the TDV 115 is electrically coupled to a die (e.g., a die 114 or a base die 103) at a bottom end and direct bonded the second base die 103-2 at a top end. In some embodiments, the second base die 103-2 may electrically couple the dies 114 and the first base die 103-1 together through the TDVs 115. As used herein, the term "direct bonding" is used to include metal-to-metal bonding techniques (e.g., copper-to-copper bonding, or other techniques in which the conductive contacts of opposing interfaces are brought into contact first, then subject to heat and/or compression) and hybrid bonding techniques (e.g., techniques in which the dielectric material of opposing interfaces are brought into contact first, then subject to heat and sometimes compression, or techniques in which the conductive contacts and the dielectric material of opposing interfaces are brought into contact substantially simultaneously, then subject to heat and compression). In such techniques, elevated pressures and/or temperatures may be applied to cause the contacting conductive contacts and/or the contacting dielectric materials to bond.

Figure 5B:
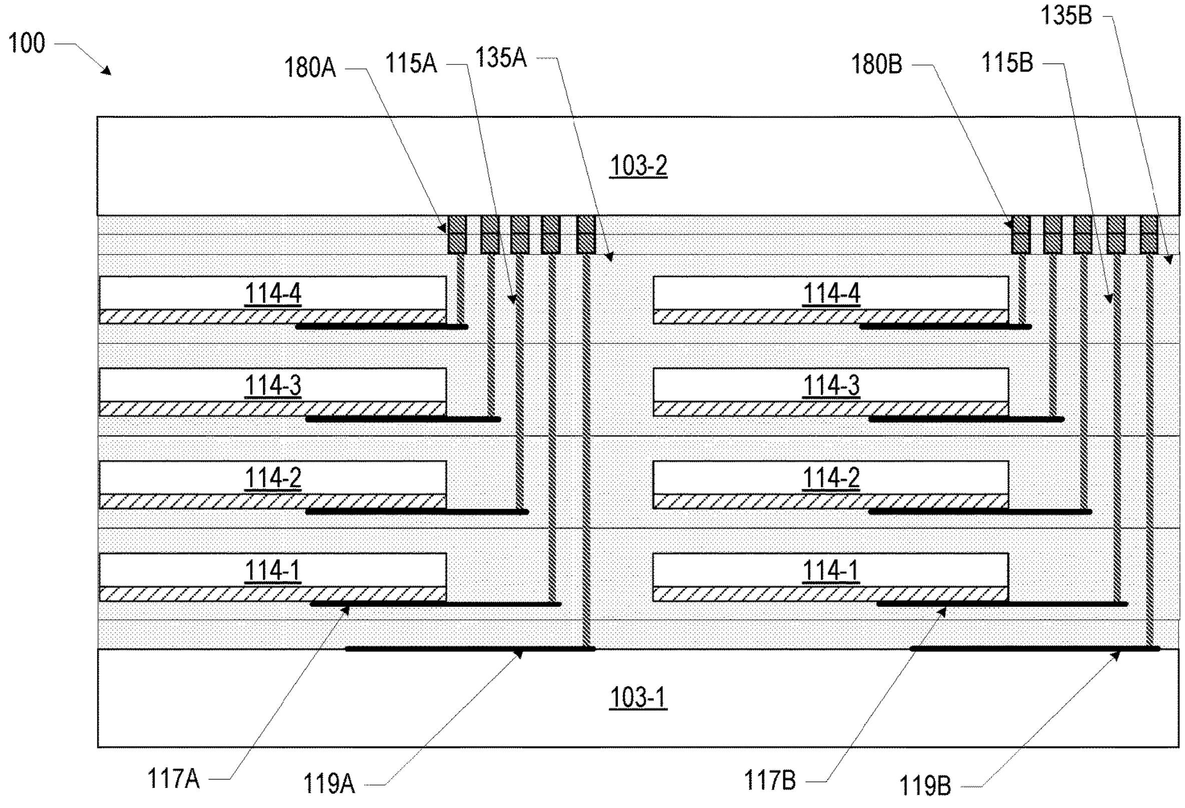

FIG. 5B is a side, cross-sectional view of another example microelectronic assembly 100, in accordance with various embodiments. The microelectronic assembly 100 of FIG. 5B illustrates an assembly having a plurality of vertically stacked dies and a plurality of trenches 135 with TDVs 115. For example, the microelectronic assembly 100 may include a first base die 103-1 with a multi-tiered die assembly 104 having vertically stacked dies 114 (e.g., dies 114-1, 114-2, 114-3, and 114-4). The microelectronic assembly may include first TDVs 115A in a first trench 135A electrically coupled to the conductive pathways 117A of the dies 114 and the conductive pathway 119A of the base die 103-1 at one end and electrically coupled by direct bonding interconnects 180A to a second base die 103-2 at an opposing end. The microelectronic assembly may further include second TDVs 115B in a second trench 135B electrically coupled to the conductive pathways 117B of the dies 114 and the conductive pathway 119B of the first base die 103-1 at one end and electrically coupled by direct bonding interconnects 180B to a second base die 103-2 at an opposing end.

Figure 5C:
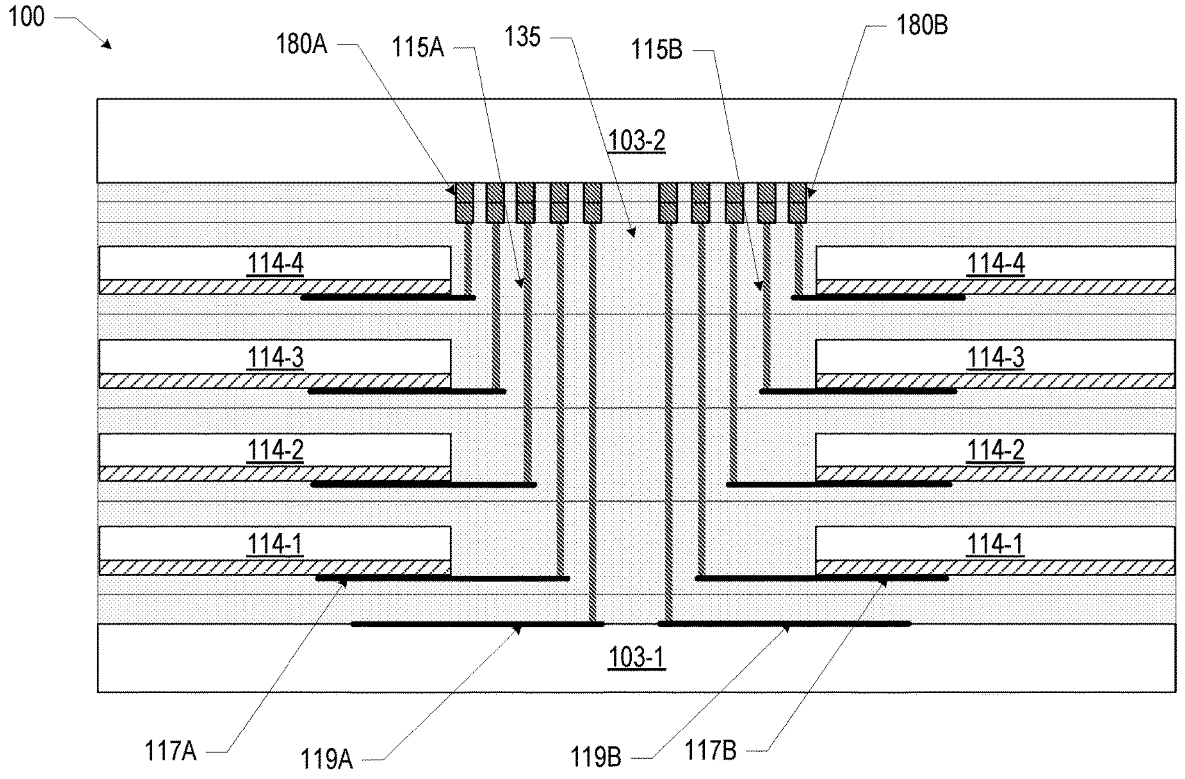

FIG. 5C is a side, cross-sectional view of another example microelectronic assembly 100, in accordance with various embodiments. The microelectronic assembly 100 of FIG. 5C illustrates an assembly having a plurality of vertically stacked dies where the plurality of stacked dies has a trench of dielectric material through the dies and a plurality of first TDVs 115A and second TDVs 115B. For example, the microelectronic assembly 100 may include a first base die 103-1 with a multi-tiered die assembly 104 having vertically stacked dies 114 (e.g., dies 114-1, 114-2, 114-3, and 114-4). The microelectronic assembly may include first TDVs 115A electrically coupled on a first side of the trench 135 to the conductive pathways 117A of the dies 114 and the conductive pathway 119A of the first base die 103-1 at one end and electrically coupled by direct bonding interconnects 180A to a second base die 103-2 at an opposing end. The microelectronic assembly may further include second TDVs 115B electrically coupled on a second side of the trench 135 to the conductive pathways 117B of the dies 114 and the conductive pathway 119B of the first base die 103-1 at one end and electrically coupled by direct bonding interconnects 180B to a second base die 103-2 at an opposing end. conductive pathway 117

Figure 5D:
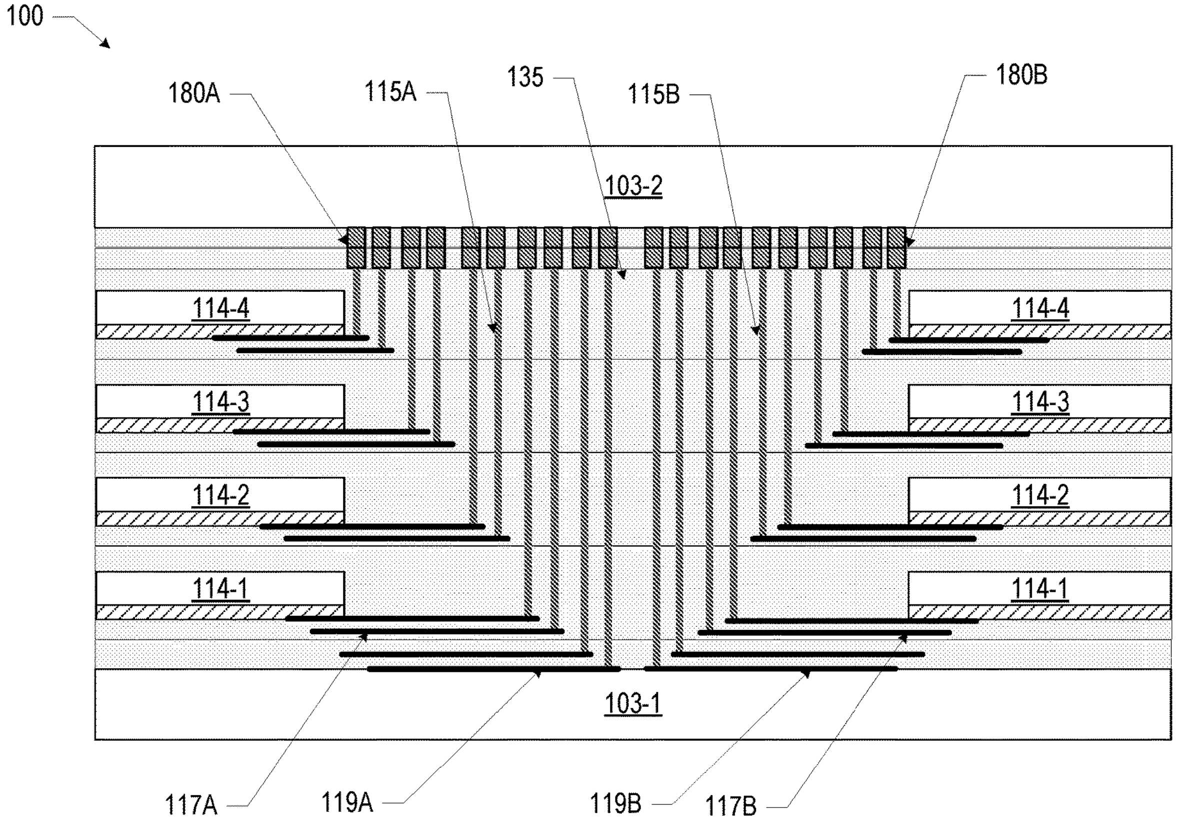

FIG. 5D is a side, cross-sectional view of another example microelectronic assembly 100 having two TDVs electrically coupled to individual two conductive contacts, in accordance with various embodiments. The microelectronic assembly 100 of FIG. 5D illustrates an assembly having a plurality of vertically stacked dies where the plurality of stacked dies has a trench of dielectric material through the dies, a plurality of TDVs through the trench 165, where more than one TDV is electrically coupled to a die. For example, the microelectronic assembly 100 may include a first base die 103-1 with a multi-tiered die assembly 104 having vertically stacked dies 114 (e.g., dies 114-1, 114-2, 114-3, and 114-4) and a trench 135 of dielectric material with a plurality of first TDVs 115A and a plurality of second TDVs 11513 through the dielectric material. The microelectronic assembly may include two first TDVs 115A electrically coupled on a first side of the trench 135 to individual conductive pathways 117A of the dies 114 and to the conductive pathway 119A of the first base die 103-1. The microelectronic assembly may further include two second TDVs 115B electrically coupled on a second side of the trench 135 to individual conductive pathways 117B of the dies 114 and to the conductive pathway 119B of the first base die 103-1. The TDVs 115A, 115B may be electrically coupled to the dies 114 and the first base die 103-1 at one end and electrically coupled by direct bonding interconnects 180B to the second base die 103-2 at an opposing end.

Figure 8:
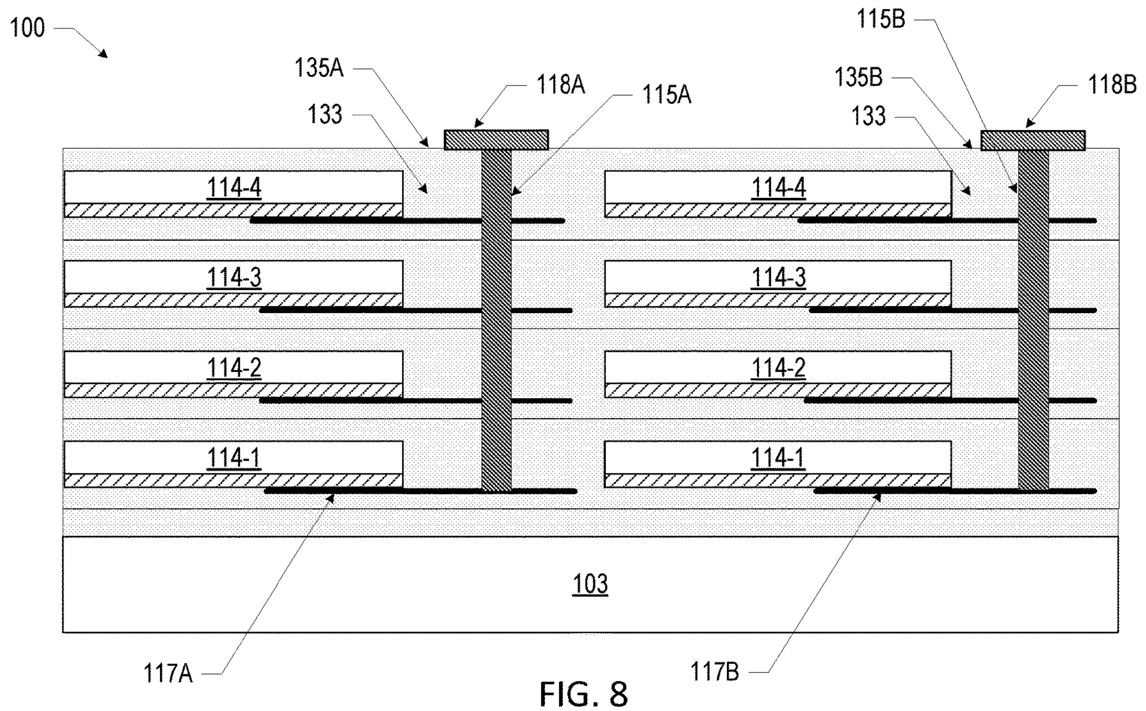
FIG. 8 is a side, cross-sectional view of another exemplary microelectronic assembly, in accordance with various embodiments.

FIG. 6 is a side, cross-sectional view of another example microelectronic assembly 100 having a single TDV electrically coupling a plurality of vertically stacked dies, in accordance with various embodiments. The microelectronic assembly 100 of FIG. 6 illustrates an assembly having a plurality of vertically stacked dies including a first trench 135A and a second trench 135B of dielectric material 133 through the dies 114 (e.g., dies 114-1, 114-2, 114-3, and 114-4). The first trench 135A having a first TDV 115A and a second trench 135B having a second TDV 115B electrically coupled to the vertically stacked dies 114. For example, the microelectronic assembly 100 may include a base die 103 with a multi-tiered die assembly 104 having vertically stacked dies 114. The microelectronic assembly may include a first TDV 115A through a first trench 135A of dielectric material 133 electrically coupled to the conductive pathways 117A of the dies 114. The microelectronic assembly may further include a second TDV 115B through a second trench 135B of dielectric material 133 electrically coupled to the conductive pathways 1178 of the dies 114. In some embodiments, the first and second TDVs 115A, 115B may be stepped-shape (e.g., as shown in FIG. 6) or may have other shapes (e.g., as shown in FIGS. 8, 11, and 13). The TDVs 115A, 115B may have a conductive pathway 118A, 118B at a top surface to electrically couple the dies 114 to the base die 103 and/or to other components (not shown) of the microelectronic assembly 100. Although FIG. 6 shows a single TDV in a trench, a trench may have any number of TDVs including two or more TDVs.

Figure 7A:
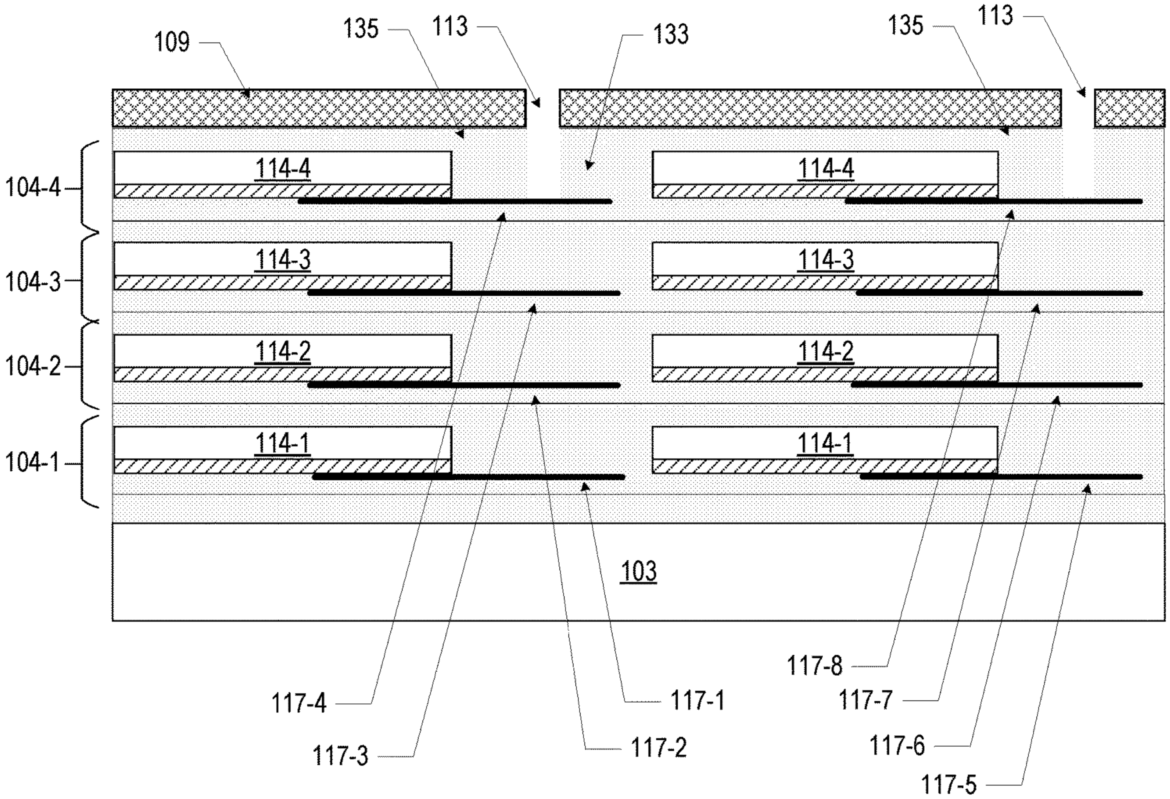
FIGS. 7A-7E are side, cross-sectional views of an exemplary process for manufacturing a microelectronic assembly, in accordance with various embodiments.

FIGS. 7A-7E illustrate another example process for forming via openings and depositing a conductive material to create TDVs 115. FIG. 7A illustrates an assembly subsequent to depositing and patterning a masking material 109 on a top surface (e.g., patterning the masking material 109 with openings 113 for forming vias) and forming a via opening 113 through the dielectric material 133 in the trench 135 to the conductive pathways 117-4, 117-8 in the layer 104-4. The assembly of FIG. 7A may be formed using any suitable technique, including any of the techniques described above in FIGS. 2-4. The assembly of FIG. 7A may include vertically stacked dies 114 having conductive pathways 117 (e.g., dies 114-1, 114-2, 114-3, 114-4 with first conductive pathways 117-1, 117-2, 117-3, 117-4, respectively, and second conductive pathways 117-5, 117-6, 117-7, 117-8, respectively). The masking material 109 may include any suitable material, such as, a thick metal material and may be deposited and patterned using any suitable technique. The via opening 113 may be formed using any suitable technique, including a selective etch for the dielectric material 133 in the trench 135 (e.g., a high aspect ratio etch) that stops at the metal material of the conductive pathways 117-4, 117-8.

Figure 7B:
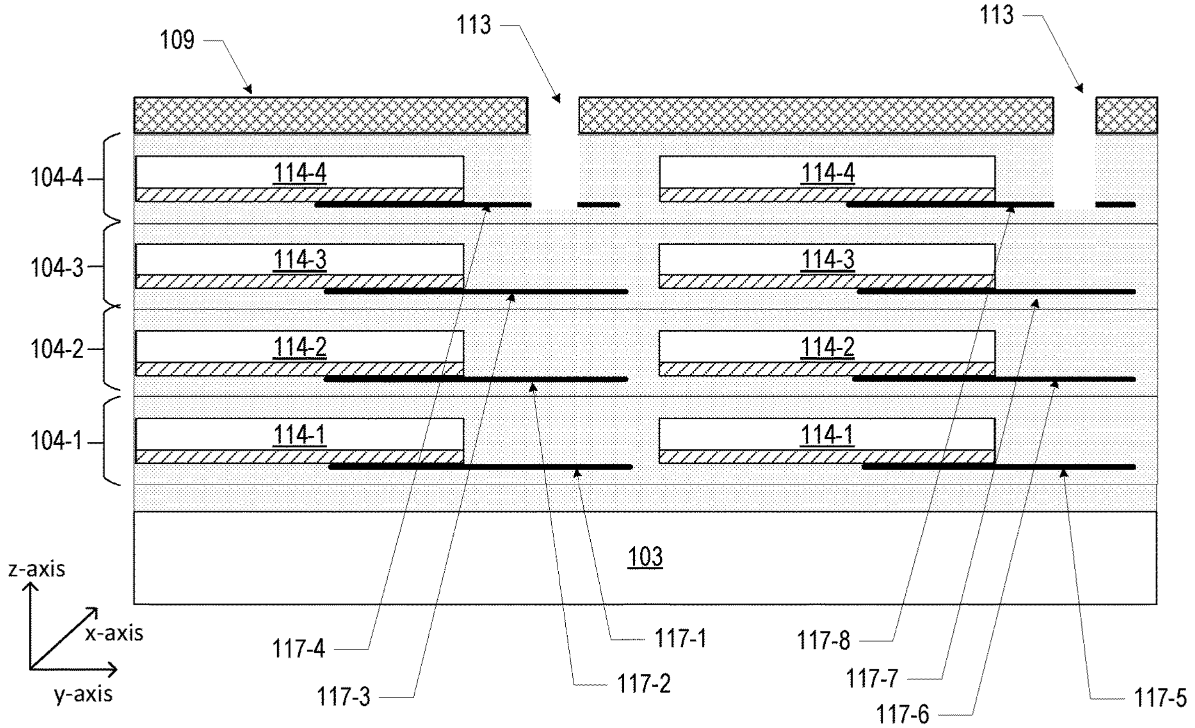

FIG. 7B illustrates an assembly subsequent to selectively removing the metal material of the conductive pathways 117-4, 117-8. The metal material of the conductive pathways 117-4, 117-8 may be removed using any suitable technique, such as a timed metal etch. If a metal masking material 109 is used, a timed metal etch may remove a portion of the metal masking material 109 (e.g., may “shrink” the mask) and may form a larger opening 113 in the metal masking material 109, as shown in FIG. 7B.

Figure 7C:
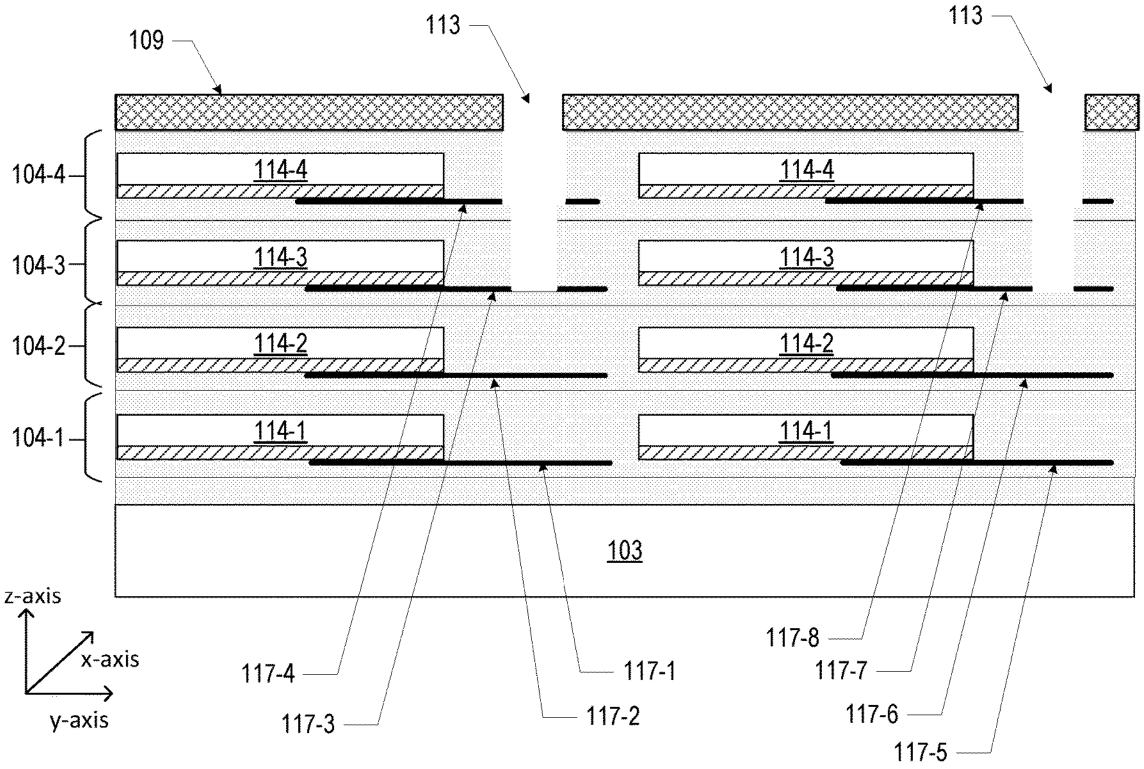

FIG. 7C illustrates an assembly subsequent to forming a via opening 113 through the dielectric material 133 in the layer 104-3 to the conductive pathways 117-3, 117-7 and selectively removing the metal material of the conductive pathways 117-3, 117-7. The dielectric material 133 of layer 104-3 may be removed using any suitable technique, including a selective etch for the dielectric material 133, which may remove dielectric material 133 from via opening in the previous layer 104-4, such that the via opening 113 in the layer 104-4 has a larger cross-section dimension (e.g., x-dimension and/or y-dimension) as compared to the via opening 113 in the layer 104-3. The larger cross-section dimension of the via opening 113 in the layer 104-4 may expose additional metal material of the conductive pathways 117-4, 117-8, such that when the metal material of the conductive pathways 117-3, 117-7 in the layer 104-3 is removed, for example, using a timed metal etch, the newly exposed metal material of the conductive pathways 117-4, 117-8 in the layer 104-4 may be removed as well.

Figure 7D:
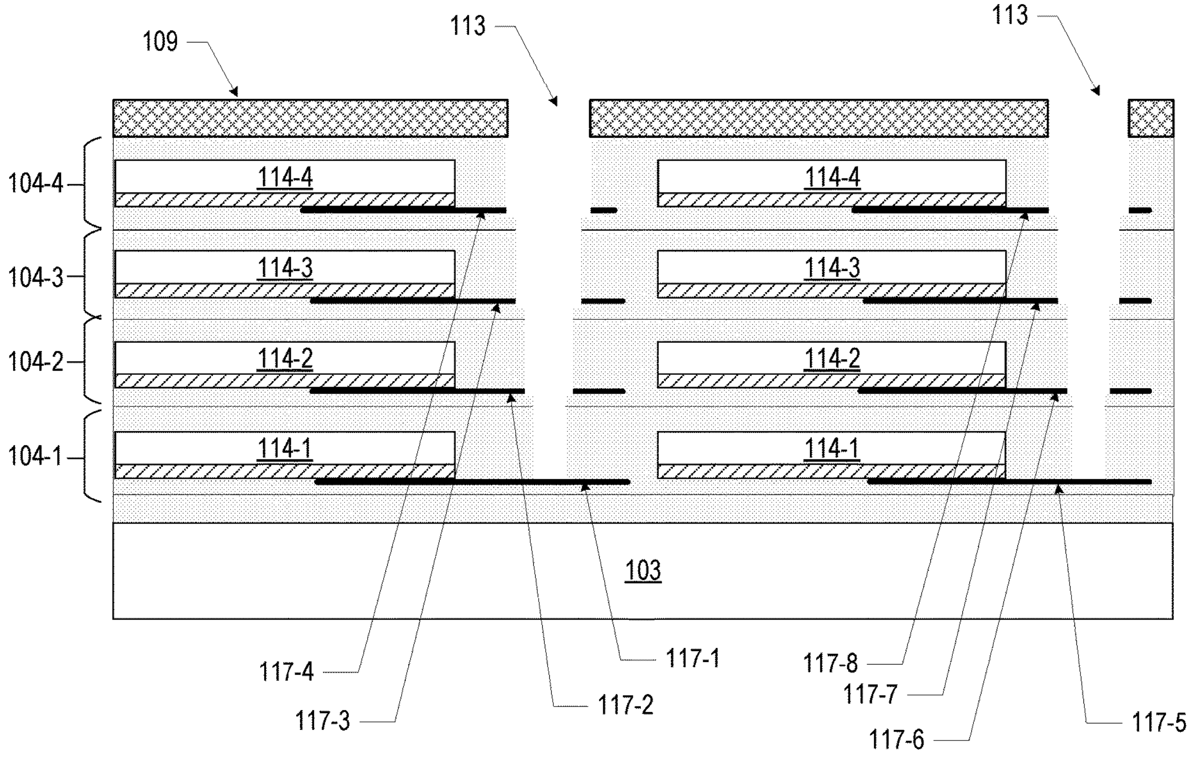

FIG. 7D illustrates an assembly subsequent to forming a via opening through layers 104-2 and 104-1 and exposing the conductive pathways 117-1, 117-5 in the layer 104-1 by removing the dielectric and metal materials, as described above in FIG. 7C.

Figure 7E:
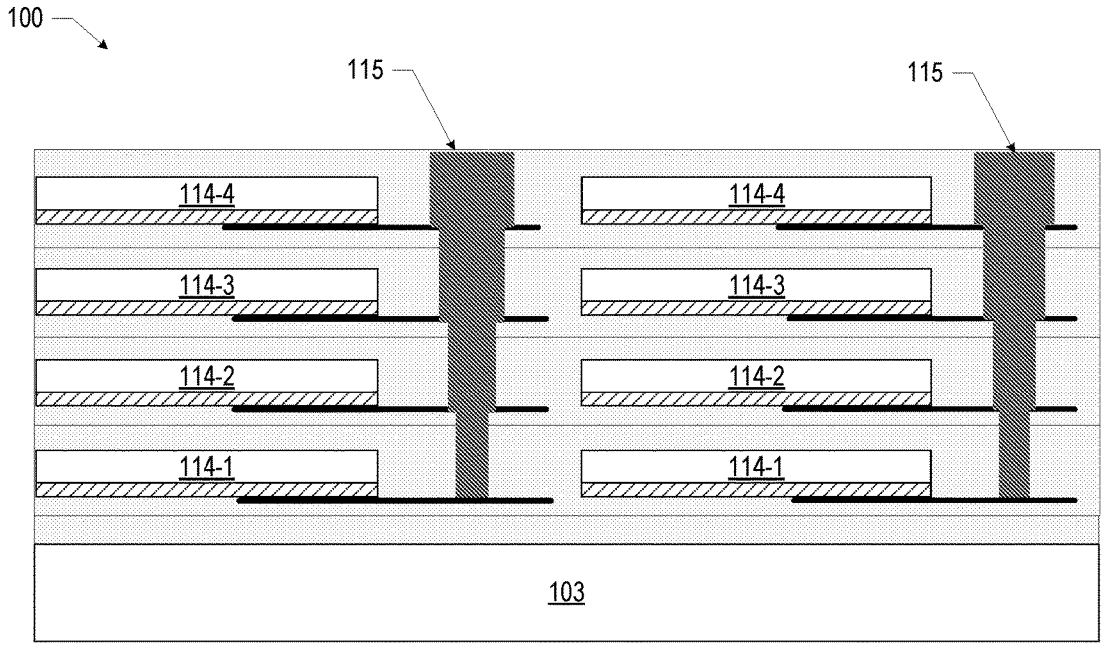

FIG. 7E illustrates an assembly subsequent to removing the mask material 109 and depositing a conductive material, such as copper, nickel, molybdenum, ruthenium, cobalt, polysilicon, or tungsten, in the via openings 113 to form the conductive TDVs 115. The conductive material may be deposited using any suitable process, such as electroplating, ALD, sputtering, or electroless plating. In some embodiments, the via openings 113 may undergo a cleaning process prior to depositing the conductive material. If multiple assemblies are manufactured together, the assemblies may be singulated. Further manufacturing operations may be performed on the microelectronic assembly 100 of FIG. 7E to form other microelectronic assemblies 100. For example, the assembly of FIG. 7E may undergo a finishing process and/or a metallization or RDL process on a top surface of the assembly to electrically couple the TDVs 115 together (e.g., form the conductive pathways 118A, 118B of FIG. 6). In another example, a bottom surface of the base die 103 of the assembly of FIG. 7E may be electrically coupled to a package substrate 102 by first level interconnects 120 and the package substrate 102 may be electrically coupled to a circuit board 131 by second level interconnects 130.

FIG. 8 is a side, cross-sectional view of another example microelectronic assembly 100 having a single TDV electrically coupling a plurality of vertically stacked dies, in accordance with various embodiments. The microelectronic assembly 100 of FIG. 8 illustrates an assembly including a plurality of vertically stacked dies having a first trench 135A and a second trench 135B of dielectric material 133 through the dies 114 (e.g., dies 114-1, 114-2, 114-3, and 114-4). The first trench 135A having a first TDV 115A and a second trench 135B having a second TDV 115B electrically coupled to the vertically stacked dies 114. The microelectronic assembly may include a first TDV 115A through a first trench 135A of dielectric material 133 electrically coupled to the conductive pathways 117A of the dies 114. The microelectronic assembly may further include a second TDV 115B through a second trench 135B of dielectric material 133 electrically coupled to the conductive pathways 117B of the dies 114. In some embodiments, the first and second TDVs 115A, 115B may be cylindrical or rectangular in shape (e.g., as shown in FIG. 8). The TDVs 115A, 115B may have a conductive pathway 118A, 118B at a top surface to electrically couple the dies 114 to the base die 103 and/or to other components (not shown) of the microelectronic assembly 100.

Figure 9A:
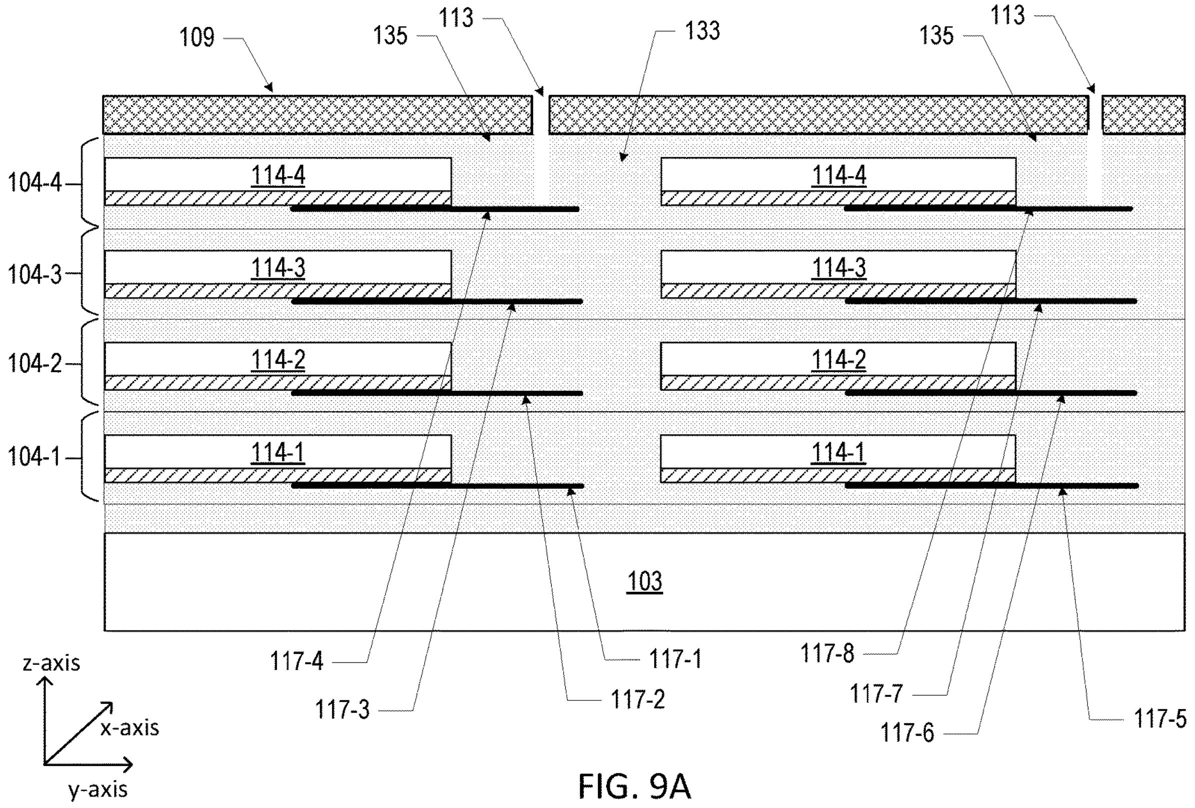
FIGS. 9A-9E are side, cross-sectional views of an exemplary process for manufacturing a microelectronic assembly, in accordance with various embodiments.

FIGS. 9A-9E illustrate another example process for forming via openings and depositing a conductive material to create TDVs 115. FIG. 9A illustrates an assembly subsequent to depositing and patterning a masking material 109 on a top surface (e.g., patterning the masking material 109 with openings 113 for forming vias) and forming a via opening 113 through the dielectric material 133 in the trench 135 to the conductive pathways 117-4, 117-8 in the layer 104-4. The assembly of FIG. 9A may be formed using any suitable technique, including any of the techniques described above in FIGS. 2-4. The assembly of FIG. 9A may include vertically stacked dies 114 having conductive pathways 117 (e.g., dies 114-1, 114-2, 114-3, 114-4 with first conductive pathways 117-1, 117-2, 117-3, 117-4, respectively, and second conductive pathways 117-5, 117-6, 117-7, 117-8, respectively). The masking material 109 may be any suitable material and may be deposited and patterned using any suitable technique, as described above with reference to FIG. 7. The via opening 113 may be formed using any suitable technique, including a selective etch for the dielectric material 133 in the trench 135 (e.g., a high aspect ratio etch) that stops at the metal material of the conductive pathways 117-4, 117-8.

Figure 9B:
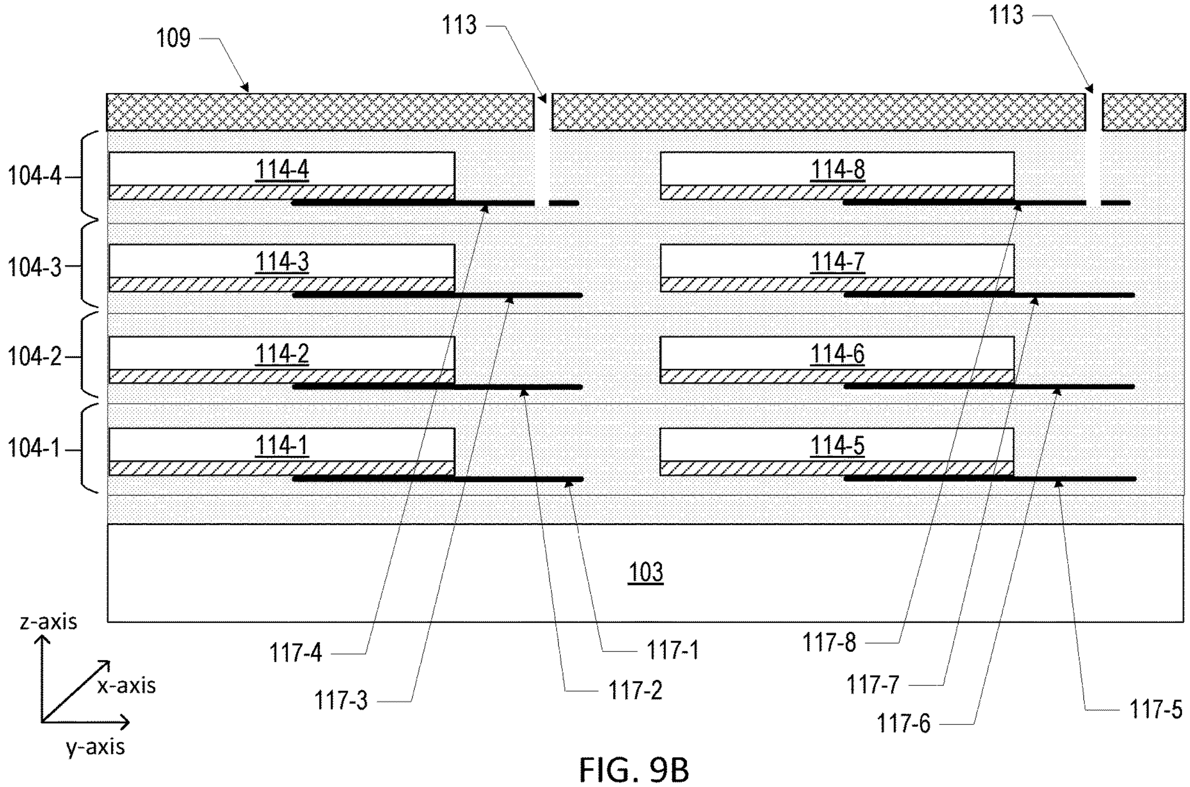

FIG. 9B illustrates an assembly subsequent to selectively removing the metal material of the conductive pathways 117-4, 117-8 in the layer 104-4. The metal material of the conductive pathways 117-4, 117-8 may be removed using any suitable technique, such as a timed metal etch, but may not "shrink" the mask, such that the via opening 113 has a same cross-section dimension (e.g., x-dimension and/or y-dimension), as shown in FIG. 9B.

Figure 9C:
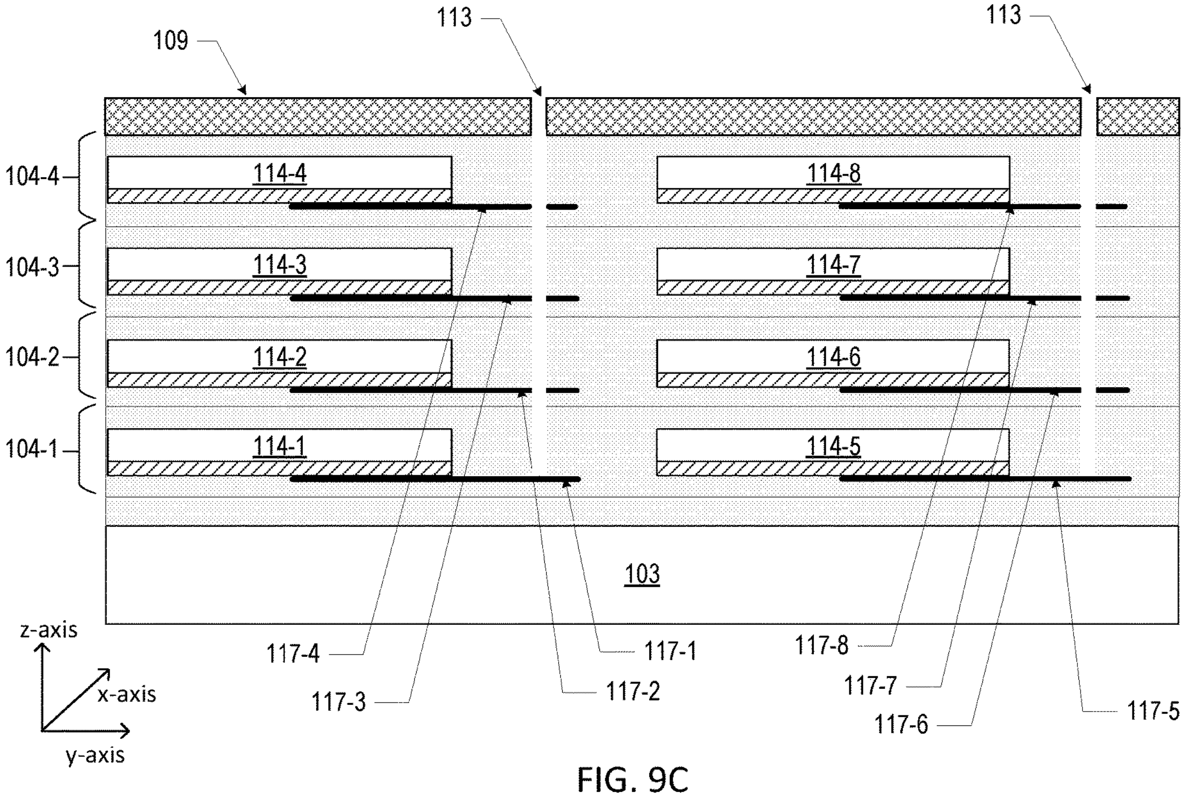

FIG. 9C illustrates an assembly subsequent to forming a via opening through layers 104-3, 104-2, and 104-1 by removing the dielectric and metal materials, as described above in FIG. 7, and exposing the conductive pathways 117-1, 117-5 in the layer 104-1.

Figure 9D:
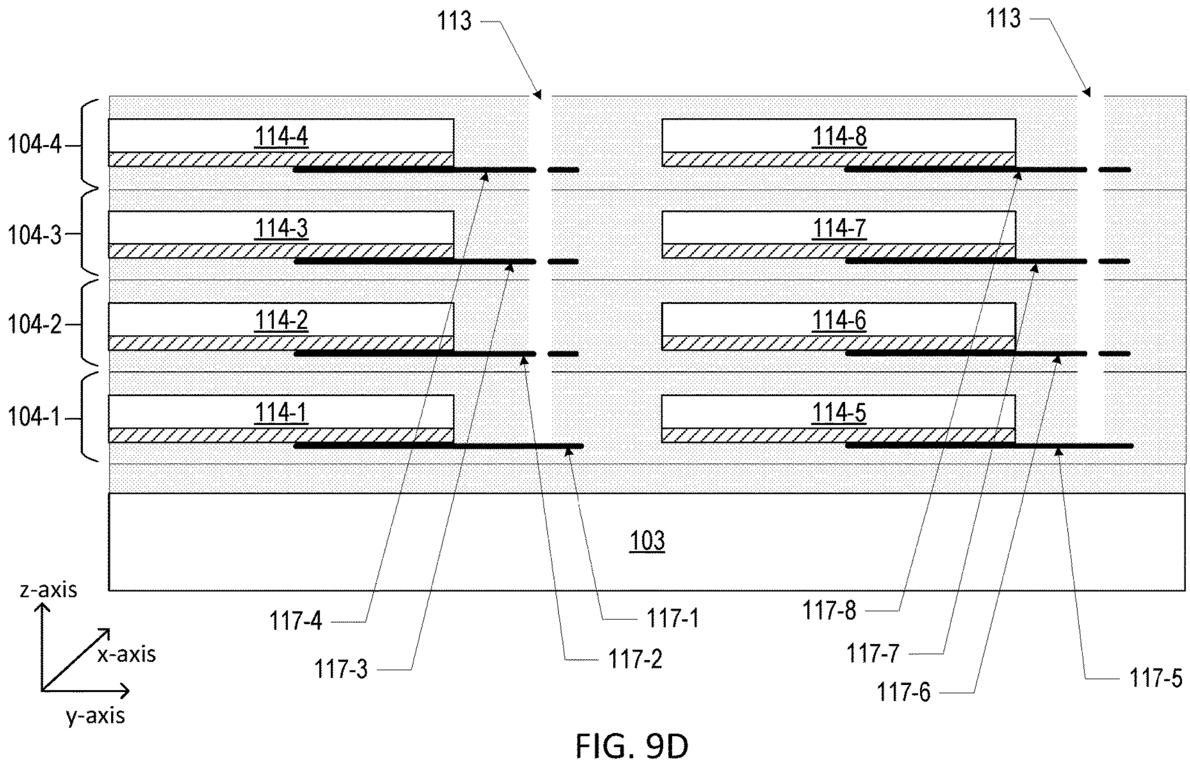

FIG. 9D illustrates an assembly subsequent to removing the mask material 109 and selectively etching dielectric material from the via opening 113 to enlarge the cross-section dimension (e.g., x-dimension and/or y-dimension) of the via opening 113 to expose a greater portion of the conductive pathways 117 to improve electrical contact between the conductive pathways 117 and the respective TDVs 115. The dielectric material may be removed from the via opening 113 using any suitable technique, including, for example, an isotropic etch.

Figure 9E:
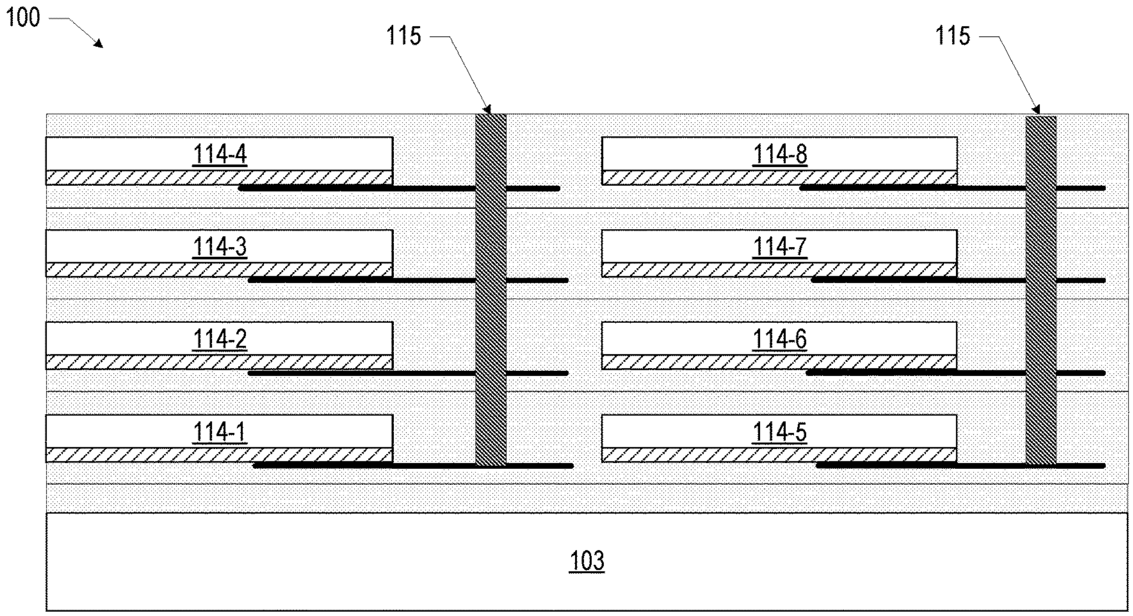

FIG. 9E illustrates an assembly subsequent to depositing a conductive material, such as copper, nickel, molybdenum, ruthenium, cobalt, polysilicon, or tungsten, in the via openings 113 to form the conductive TDVs 115. The conductive material may be deposited using any suitable process, such as electroplating, ALD, sputtering, or electroless plating. In some embodiments, the via openings 113 may undergo a cleaning process prior to depositing the conductive material. If multiple assemblies are manufactured together, the assemblies may be singulated. Further manufacturing operations may be performed on the microelectronic assembly 100 of FIG. 9E to form other microelectronic assemblies 100. For example, the assembly of FIG. 9E may undergo a finishing process and/or a metallization or RDL process on a top surface of the assembly to electrically couple the TDVs 115 together (e.g., form the conductive pathways 118 of FIG. 8). In another example, a bottom surface of the base die 103 of the assembly of FIG. 9E may be electrically coupled to a package substrate 102 by first level interconnects 120 and the package substrate 102 may be electrically coupled to a circuit board 131 by second level interconnects 130.

Figure 10:
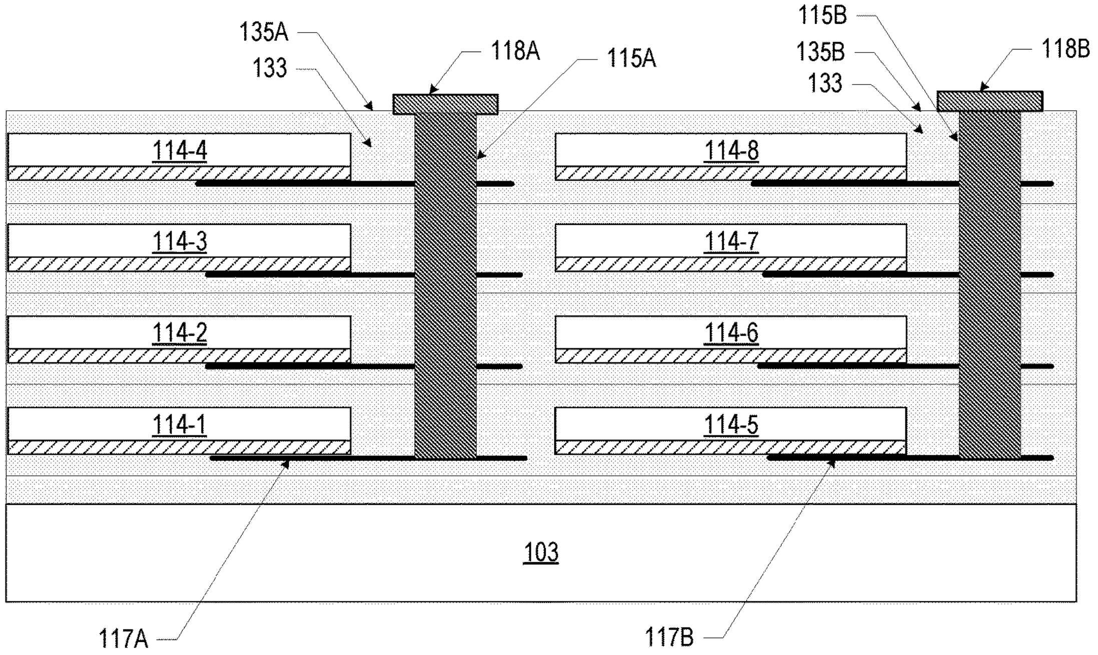
FIG. 10 is a side, cross-sectional view of another exemplary microelectronic assembly, in accordance with various embodiments.

FIG. 10 is a side, cross-sectional view of another example microelectronic assembly 100 having a single TDV electrically coupling a plurality of vertically stacked dies, in accordance with various embodiments. The microelectronic assembly 100 of FIG. 10 illustrates an assembly including a plurality of vertically stacked dies having a first trench 135A and a second trench 135B of dielectric material 133 through the dies 114 (e.g., dies 114-1, 114-2, 114-3, and 114-4). The first trench 135A having a first TDV 115A and a second trench 135B having a second TDV 115B electrically coupled to the vertically stacked dies 114. The microelectronic assembly may include a first TDV 115A through a first trench 135A of dielectric material 133 electrically coupled to the conductive pathways 117A of the dies 114. The microelectronic assembly may further include a second TDV 115B through a second trench 135B of dielectric material 133 electrically coupled to the conductive pathways 117B of the dies 114. In some embodiments, the first and second TDVs 115A, 115B may be cylindrical or rectangular in shape (e.g., as shown in FIG. 10). The TDVs 115A, 115B may have a conductive pathway 118A, 118B at a top surface to electrically couple the dies 114 to the base die 103 and/or to other components (not shown) of the microelectronic assembly 100.

Figure 11A:
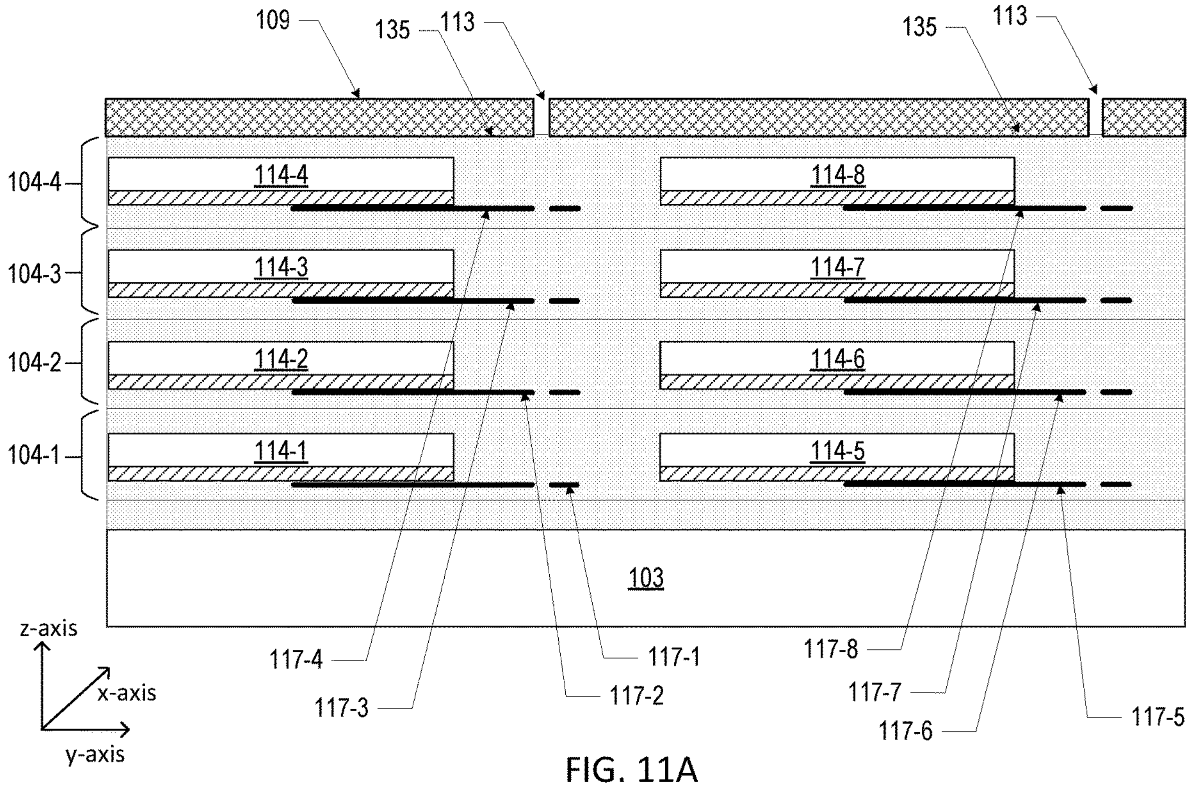
FIGS. 11A-11D are side, cross-sectional views of an exemplary process for manufacturing a microelectronic assembly, in accordance with various embodiments.

FIGS. 11A-11D illustrate another example process for forming via openings and depositing a conductive material to create TDVs 115. FIG. 11A illustrates an assembly subsequent to depositing and patterning a masking material 109 on a top surface (e.g., patterning the masking material 109 with openings for forming vias). The assembly of FIG. 11A may be formed using any suitable technique, including any of the techniques described above in FIGS. 2-4. The assembly of FIG. 11A may include vertically stacked dies 114 having conductive pathways 117 (e.g., dies 114-1, 114-2, 114-3, 114-4 with first conductive pathways 117-1, 117-2, 117-3, 117-4, respectively, and second conductive pathways 117-5, 117-6, 117-7, 117-8, respectively). The conductive pathways 117 may be patterned to be noncontinuous (e.g., have an opening that is filled with dielectric material 133) such that a via opening may be formed in a single operation by selectively removing a dielectric material, as described below with reference to FIG. 11B. The masking material 109 may be any suitable material and may be deposited and patterned using any suitable technique, as described above with reference to FIG. 7.

Figure 11B:
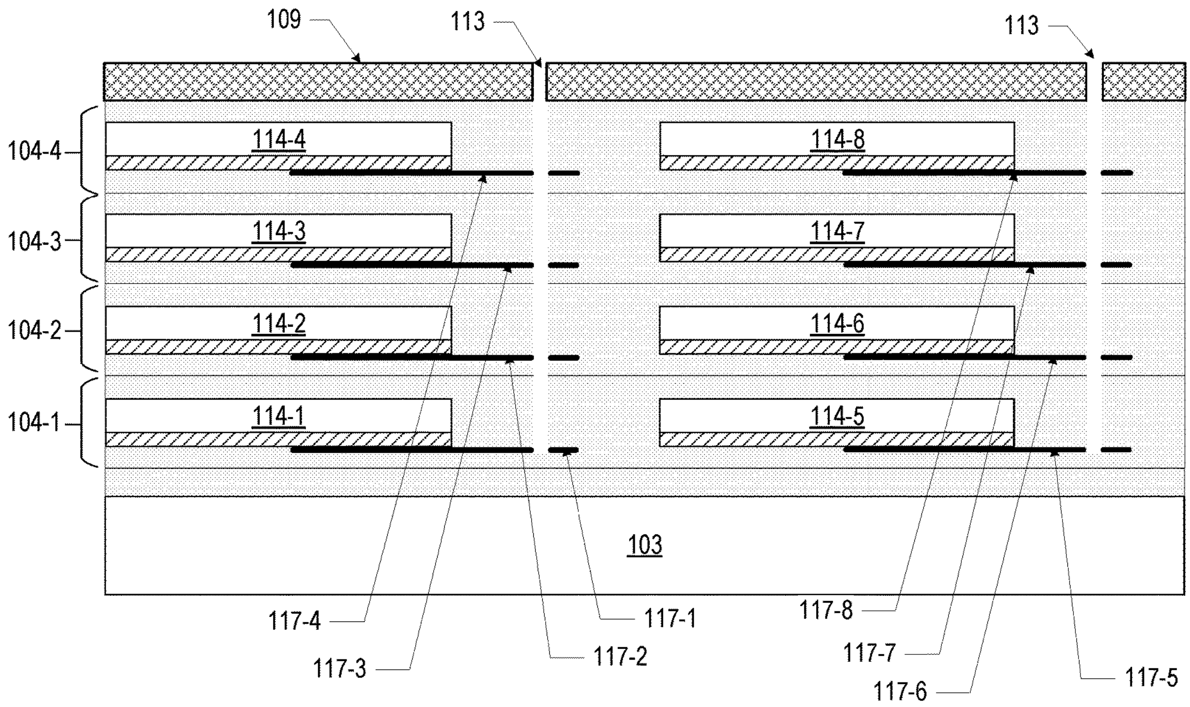

FIG. 11B illustrates an assembly subsequent to forming a via opening 113 through the dielectric material 133 in layers 104-4, 104-3, 104-2, 104-1. The via opening 113 may be formed using any suitable technique, including a selective etch for the dielectric material 133 in the trench 135 (e.g., a high aspect ratio etch).

Figure 11C:
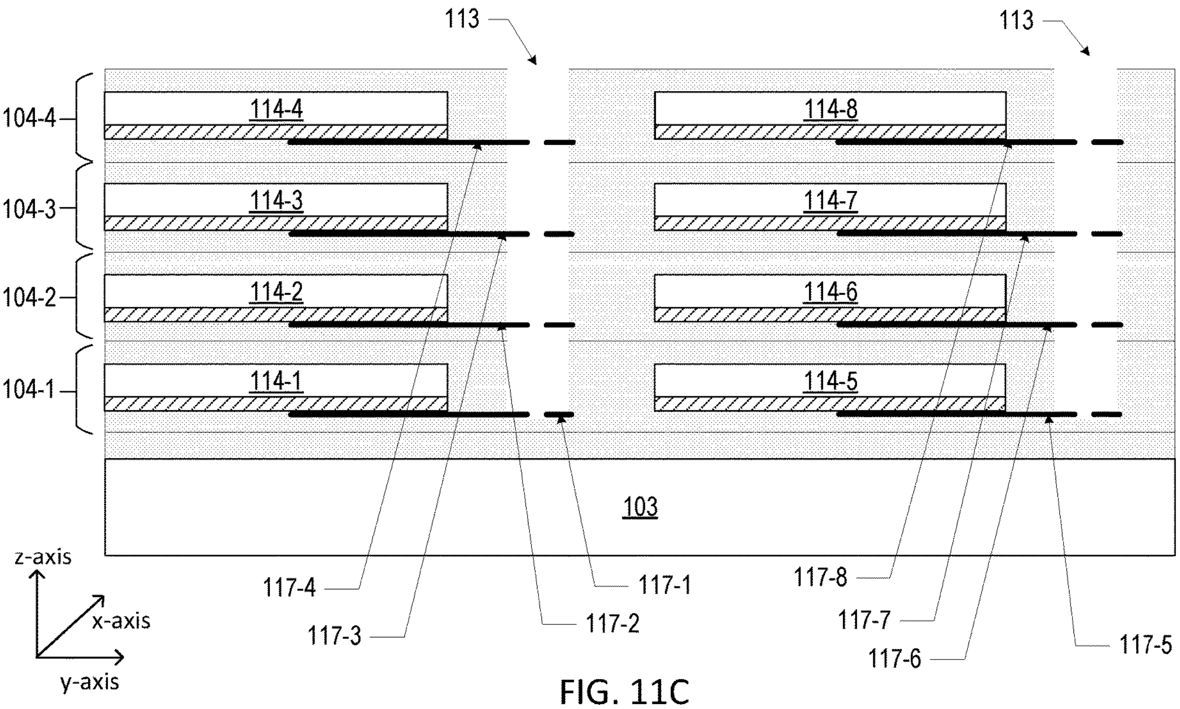

FIG. 11C illustrates an assembly subsequent to removing the mask material 109 and selectively etching dielectric material from the via opening 113 to enlarge the cross-section dimension (e.g., x-dimension and/or y-dimension) of the via opening 113 to expose a greater portion of the conductive pathways 117 to improve electrical contact between the conductive pathways 117 and the respective TDVs 115. The dielectric material may be removed from the via opening 113 using any suitable technique, including, for example, an isotropic etch.

Figure 11D:
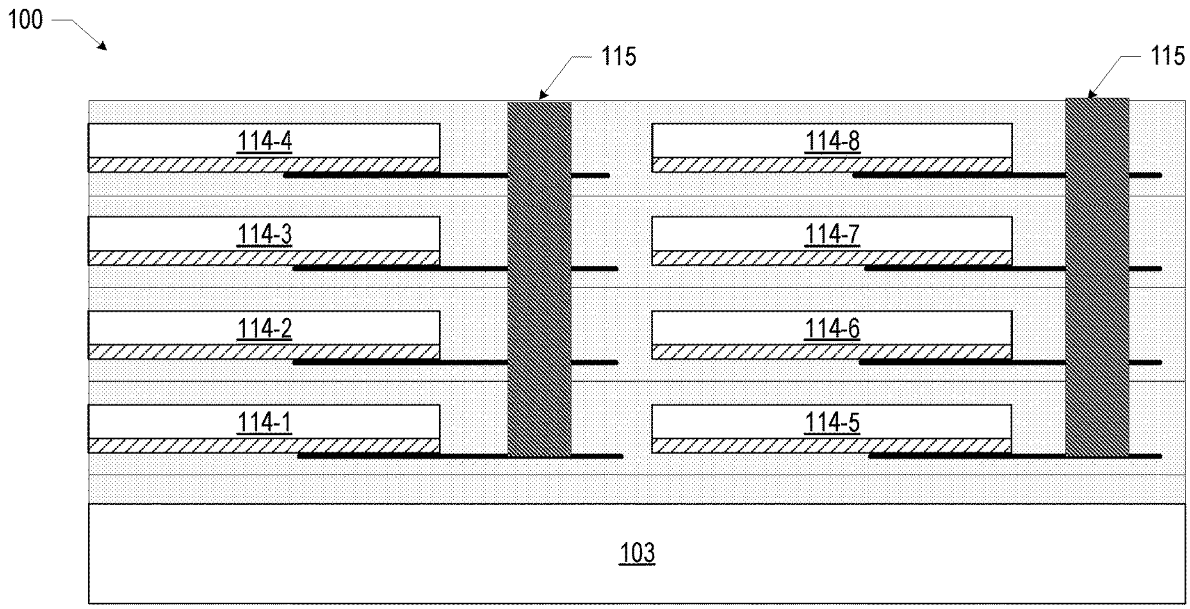

FIG. 11D illustrates an assembly subsequent to depositing a conductive material, such as copper, nickel, molybdenum, ruthenium, cobalt, polysilicon, or tungsten, in the via openings 113 to form the conductive TDVs 115. The conductive material may be deposited using any suitable process, such as electroplating, ALD, sputtering, or electroless plating. In some embodiments, the via openings 113 may undergo a cleaning process prior to depositing the conductive material. If multiple assemblies are manufactured together, the assemblies may be singulated. Further manufacturing operations may be performed on the microelectronic assembly 100 of FIG. 11D to form other microelectronic assemblies 100. For example, the assembly of FIG. 11D may undergo a finishing process and/or a metallization or RDL process on a top surface of the assembly to electrically couple the TDVs 115 together (e.g., form the conductive pathways 118 of FIG. 10). In another example, a bottom surface of the base die 103 of the assembly of FIG. 11D may be electrically coupled to a package substrate 102 by first level interconnects 120 and the package substrate 102 may be electrically coupled to a circuit board 131 by second level interconnects 130.

Figure 12A:
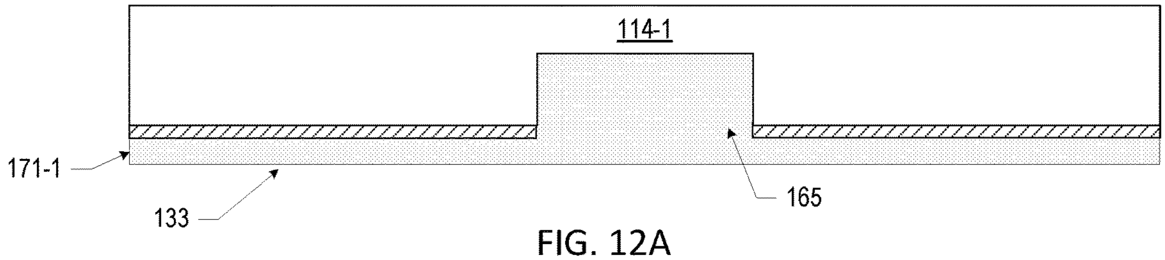
FIGS. 12A-12J are side, cross-sectional views of another exemplary process for manufacturing a microelectronic assembly, in accordance with various embodiments.

FIGS. 12A-12J are side, cross-sectional views of various stages in another example process for manufacturing the microelectronic assembly 100 of FIGS. 8 and 10, in accordance with various embodiments. FIG. 12A illustrates a die 114-1 including an opening 165 and a dielectric material 133 in the opening 165 and on an active surface 171-1 of the die 114-1. The die 114-1 may include a semiconductor die.

Figure 12B:
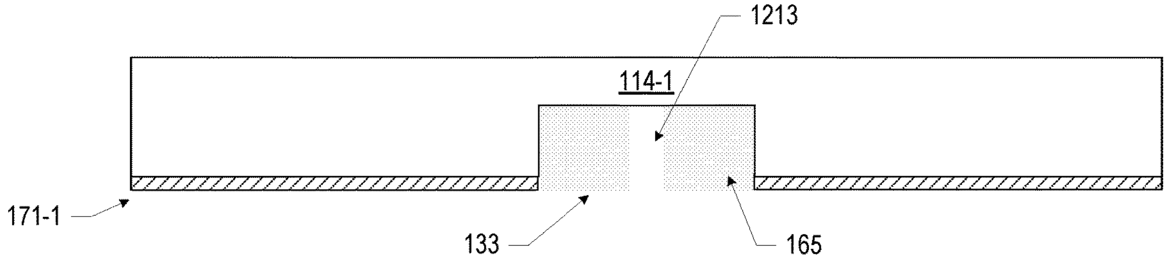
Figure 13:
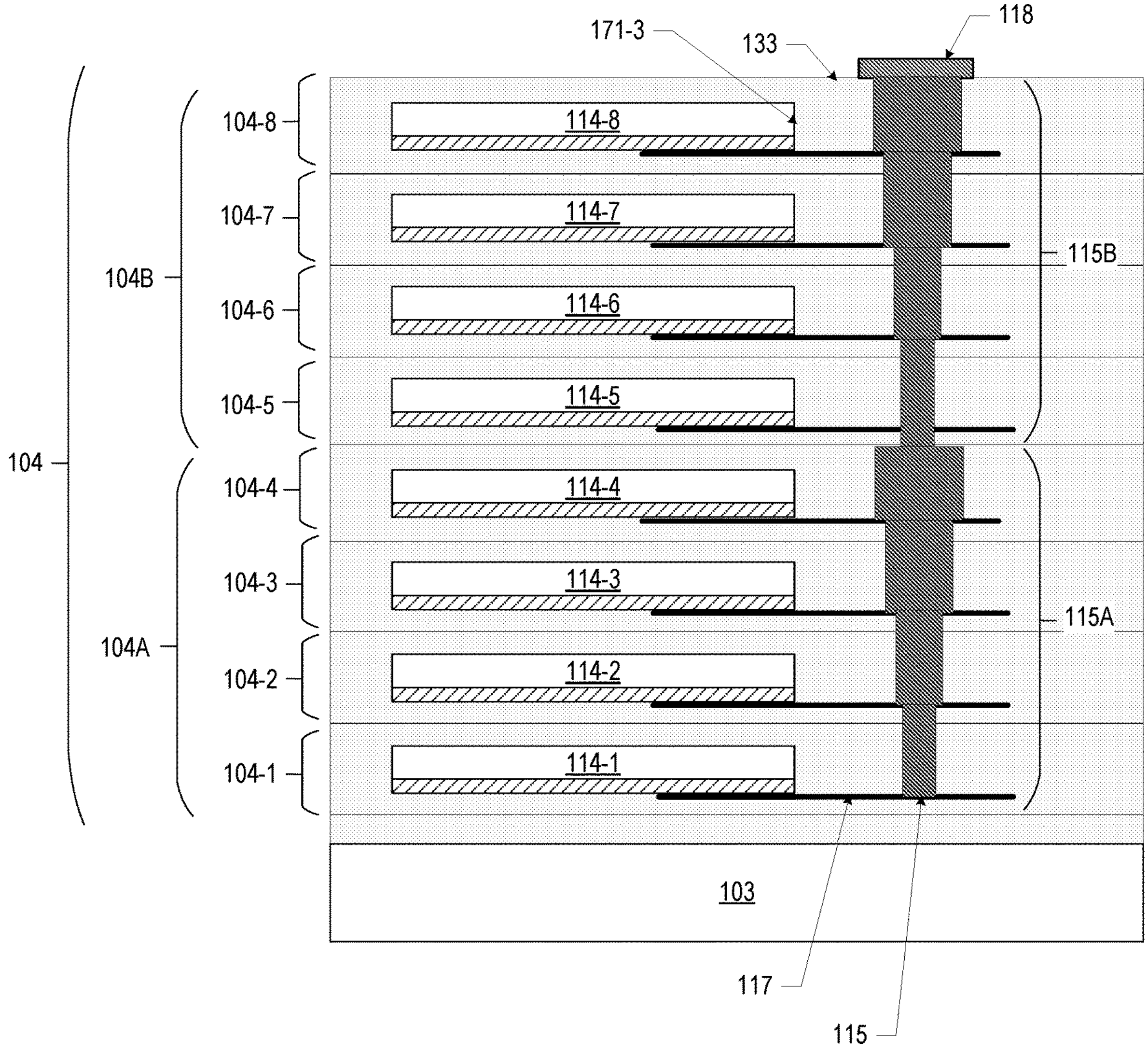
FIG. 13 is a side, cross-sectional view of another exemplary microelectronic assembly, in accordance with various embodiments.

FIG. 12B illustrates the die 114-1 subsequent to removing the dielectric material 133 on the active surface 171-1 of the die 114-1 and forming a via opening 1213 in the opening 165 by selectively removing the dielectric material 133 in the opening 165. The dielectric material 133 may be removed using any suitable technique, including, for example, as described above with reference to FIG. 2.

Figure 12C:
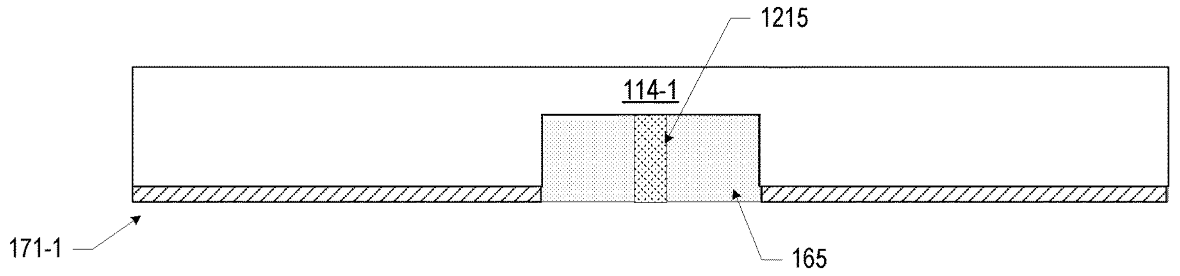

FIG. 12C illustrates the die 114-1 subsequent to depositing an etchable material 1215 in the via opening 1213 of FIG. 12B. The etchable material 1215 may be any suitable material that may be selectively and more easily etched as compared to the dielectric material 133 in the trench 135. The etchable material 1215 may be deposited using any suitable technique and may enable very fine pitch vias with very high aspect ratios, for example, vias having aspect ratios (height:diameter) of above 50:1.

Figure 12D:
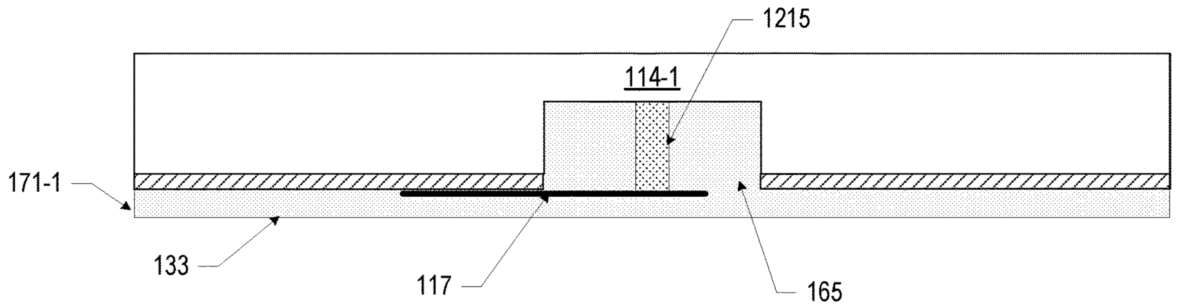

FIG. 12D illustrates a die 114-1 subsequent to forming a conductive pathway 117 in a dielectric material 133 at the active surface 171-1. The conductive pathway 117 may be formed using any suitable technique, such as described above with reference to FIG. 2.

Figure 12E:
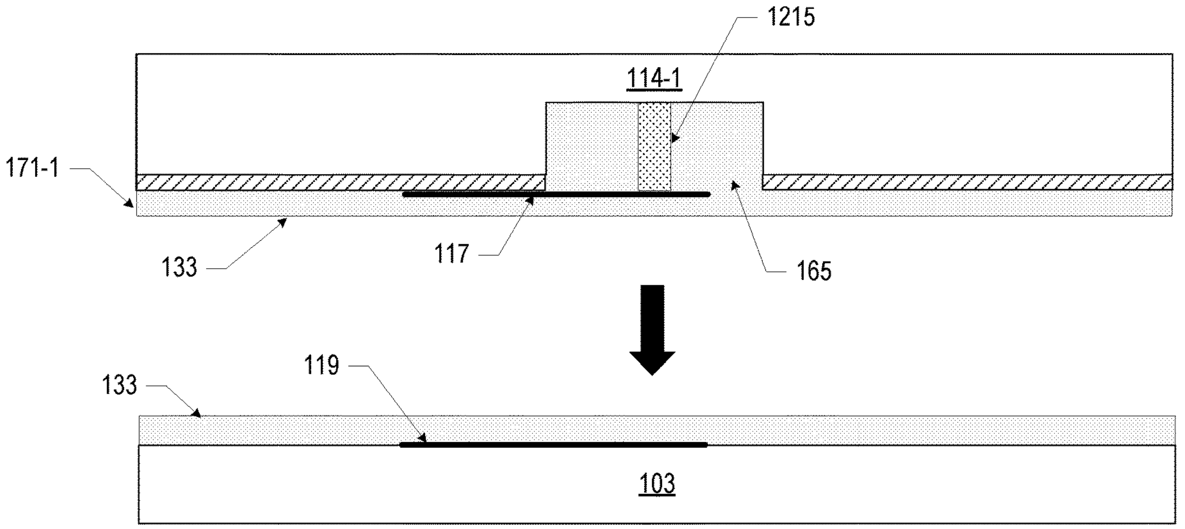

FIG. 12E illustrates the die 114-1 of FIG. 12D aligned with a base die 103 including a conductive pathway 119 in a dielectric material 133. The die 114-1 is positioned with the active surface 171-1 facing towards the conductive pathway 119 on the surface of the base wafer 103. The base die 103 may include a semiconductor die. In some embodiments, a carrier may be used instead of a base die 103.

Figure 12F:
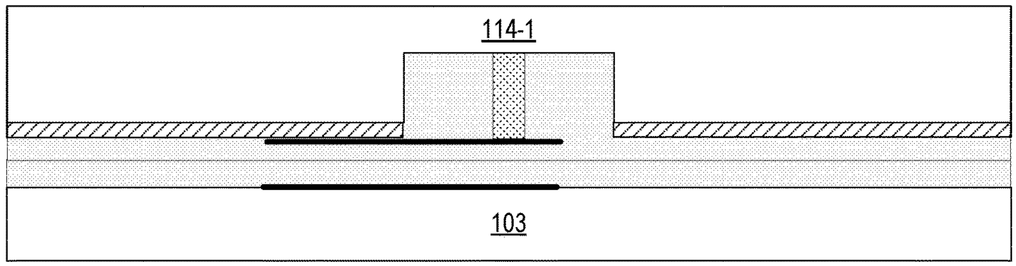

FIG. 12F illustrates an assembly subsequent to attaching the active surface 171-1 of the die 114-1 to the surface of the base die 103. The die 114-1 may be attached to the base die 103 using any suitable technique, as described above with reference to FIG. 2.

Figure 12G:
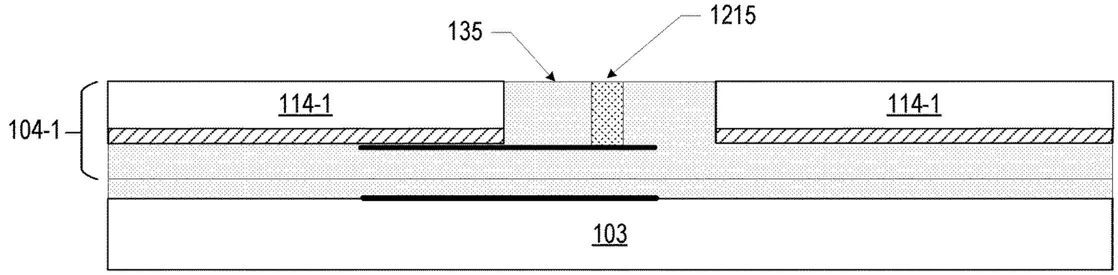
Figure 12H:
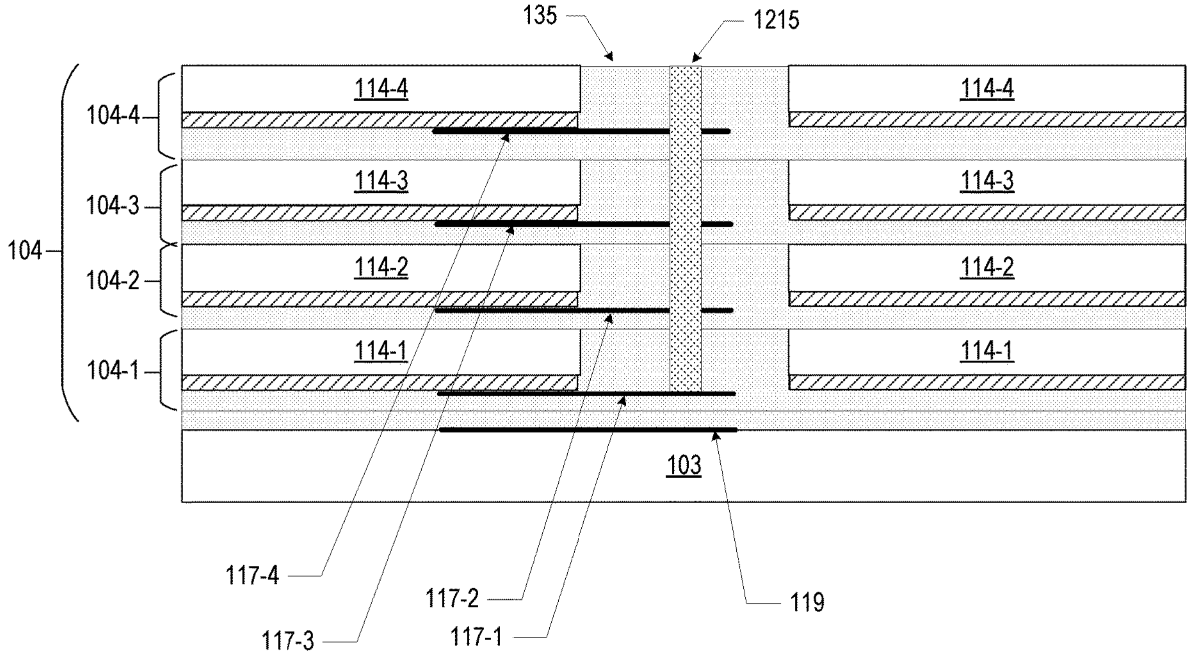

FIG. 12G illustrates an assembly subsequent to removing material from the top surface of the die 114-1 to expose the trench 135 and the dielectric material 133 and the etchable material 1215 in the trench 135 to form a first layer 104-1. A thin layer of silicon (not shown) on a top surface of the assembly of FIG. 12F may undergo an oxidation process (e.g., a thermal oxidation process) to create a thin layer of silicon dioxide for bonding to the dielectric material 133 on the active surface of a next die 114-2 (e.g., as shown in FIG. 12H). The first layer 104-1 may be formed using any suitable processes, including, as described above with reference to FIG. 2.

FIG. 12H illustrates an assembly subsequent to forming second, third, and fourth layers 104-2, 104-3, 104-4 of the multi-tiered die assembly 104 by performing the operations as described above in FIGS. 12A-12G for forming layer 104-1.

Figure 12I:
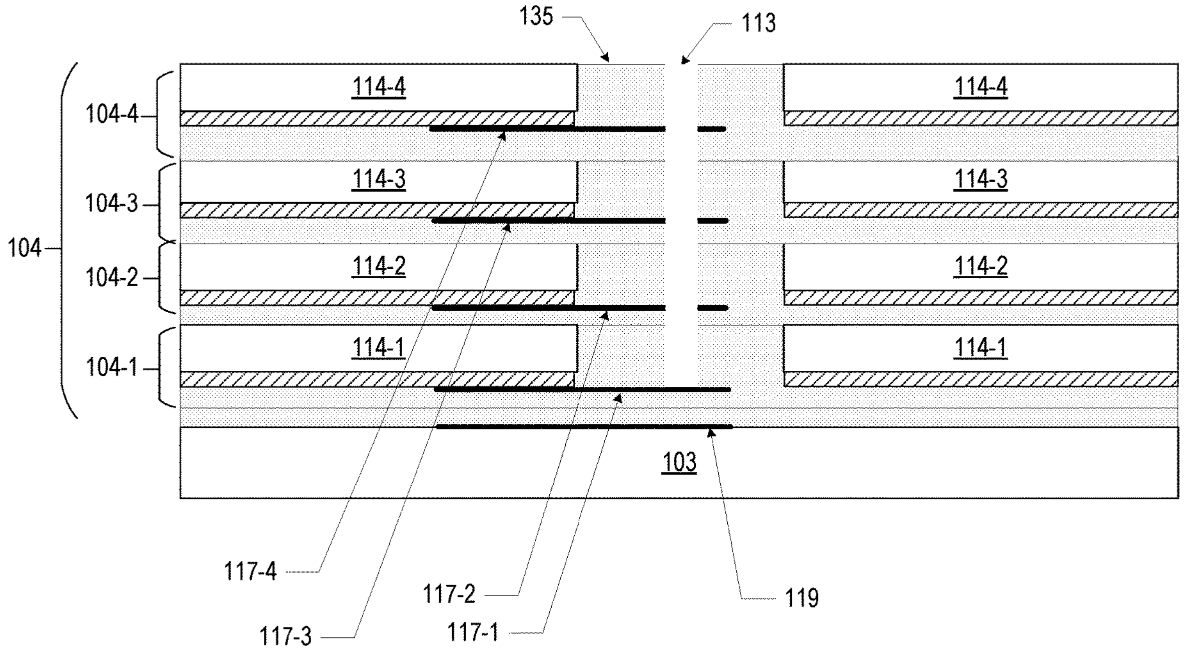

FIG. 12I illustrates an assembly subsequent to selectively removing the etchable material 1215 and forming a via opening 113 through the dielectric material 133 to the respective conductive pathways 117-1, 117-2, 117-3, 117-4. The etchable material 1215 may be removed using any suitable technique, such as a low cost wet etch.

Figure 12J:
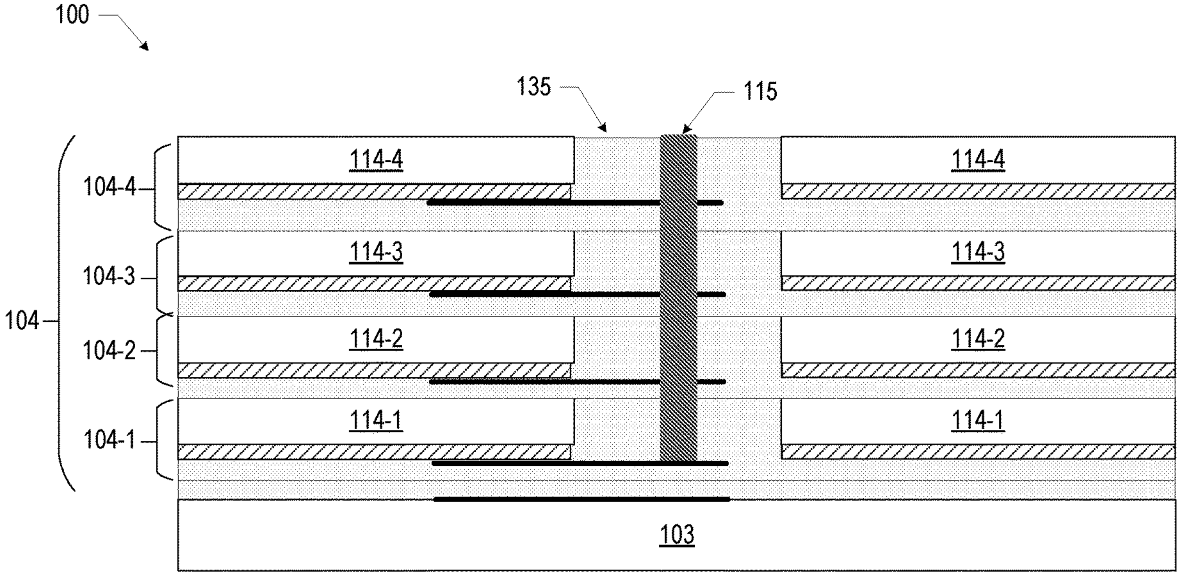

FIG. 12J illustrates an assembly subsequent to depositing a conductive material, such as copper, nickel, molybdenum, ruthenium, cobalt, polysilicon, or tungsten, in the via opening 113 to form the conductive TDV 115. The conductive material may be deposited using any suitable process, such as electroplating, ALD, sputtering, or electroless plating. In some embodiments, the via openings 113 may undergo a cleaning process prior to depositing the conductive material. If multiple assemblies are manufactured together, the assemblies may be singulated. Further manufacturing operations may be performed on the microelectronic assembly 100 of FIG. 12J to form other microelectronic assemblies 100. For example, the assembly of FIG. 12J may undergo a finishing process and/or a metallization or RDL process on a top surface of the assembly to electrically couple the TDV 115 to the base die 103 or to other components (not shown) of the microelectronic assembly 100. In another example, a bottom surface of the base die 103 of the assembly of FIG. 12J may be electrically coupled to a package substrate 102 by first level interconnects 120 and the package substrate 102 may be electrically coupled to a circuit board 131 by second level interconnects 130.

FIG. 13 is a side, cross-sectional view of another example microelectronic assembly 100 having vertically stacked TDVs 115 electrically coupling vertically stacked dies 114, in accordance with various embodiments. The microelectronic assembly 100 of FIG. 13 illustrates a base die 103 with a multi-tiered die assembly 104 including eight vertically stacked dies 114 (e.g., dies 114-1, 114-2, 114-3, 114-4, 114-5, 114-6, 114-7, 114-8) and eight layers (e.g., layers 104-1, 104-2, 104-3, 104-4, 104-5, 104-6, 104-7, 104-8), each individual die 114 having a conductive pathway 117 and a trench 135 of dielectric material 133 along a side surface 171-3 of the die 114. The multi-tiered die assembly 104 may include a first subassembly 104A and a second subassembly 104B. The vertically stacked TDV 115 may include a first TDV 115A and a second TDV 115B, where the second TDV 115B is on and electrically coupled to the first TDV 115A. The first TDV 115A may be electrically coupled to dies 114-1, 114-2, 114-3, and 114-4 and the second TDV 115B may be electrically coupled to dies 114-5, 114-6, 114-7, and 114-8. A first subassembly 104A (e.g., including the first TDV 115A and the layers 104-1, 104-2, 104-3, and 104-4) may be formed using any suitable process, including, for example, the processes as described above with reference to FIGS. 2-4, 7, 9, 11, and 12. A second subassembly 104B (e.g., including the second TDV 115B and the layers 104-5, 104-6, 104-7, and 104-8) may be formed using any suitable process, including, for example, the processes as described above with reference to FIGS. 2-4, 7, 9, 11, and 12, where the second assembly 10413 is formed on the first subassembly 104A (e.g., layer 104-5 is formed on the layer 104-4 of the first subassembly, then layer 104-6 is formed on layer 104-5, and so on until layer 104-8 is formed and the second TDV 115B is formed). In some embodiments, the first subassembly 104A and the second subassembly 104B may be formed and then the second subassembly 104B may be attached and electrically coupled to a top surface of the first subassembly 104A. The TDV 115 may have a conductive pathway 118 at a top surface to electrically couple the dies 114 to the base die 103 and/or to other components (not shown) of the microelectronic assembly 100.

Figure 14:
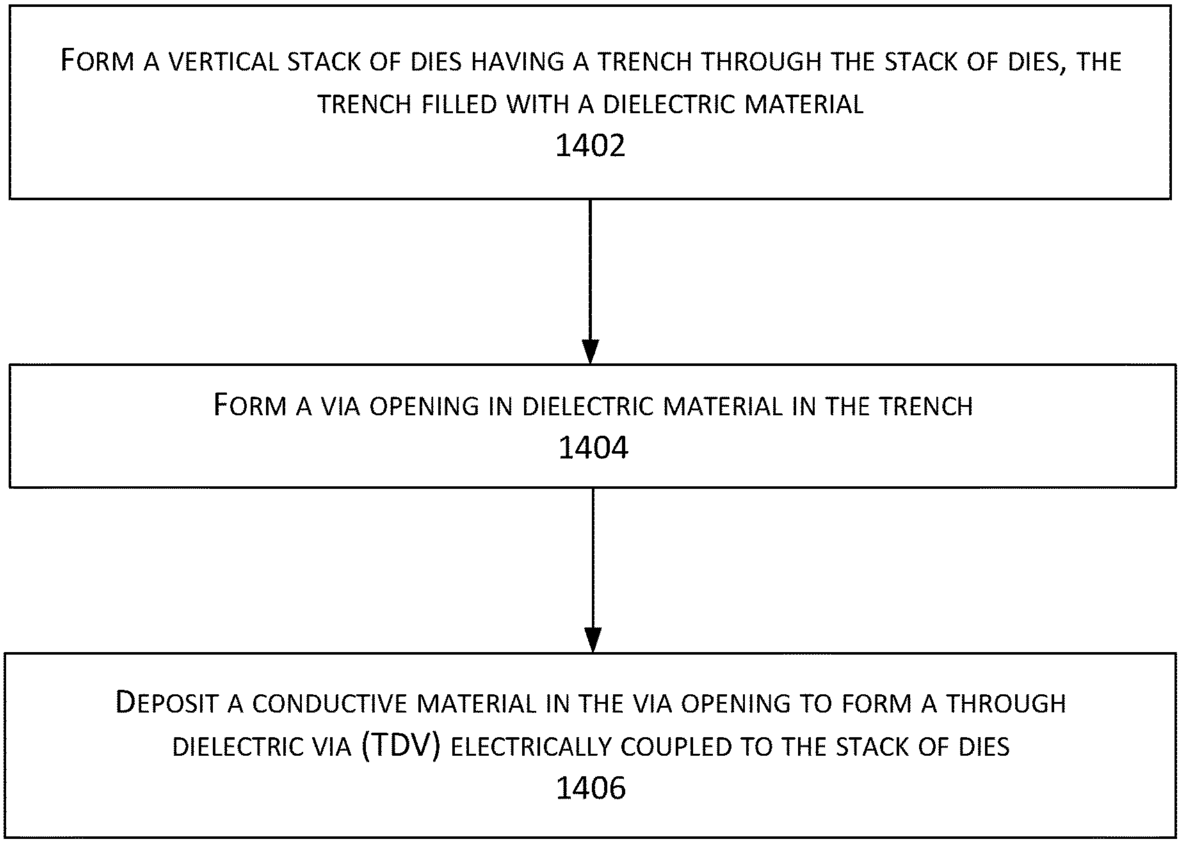
FIG. 14 is a flow diagram of an example method of manufacturing a microelectronic assembly, in accordance with various embodiments.

FIG. 14 is a flow diagram of an example method of manufacturing a microelectronic assembly, in accordance with various embodiments. At 1402, a vertical stack of dies 114 (e.g., a multi-tiered die assembly 104) having a trench 135 of dielectric material 133 through the dies 114 may be formed using any suitable process, such as the processes disclosed above with reference to FIGS. 2, 3, 4, 7, 9, 11, and 12. At 1404, a via opening 113 may be formed through the trench 135 of dielectric material 133 through the dies 114. The via opening may be formed using any suitable process, such as the processes disclosed above with reference to FIGS. 2, 3, 4, 7, 9, 11, and 12. At 1406, a conductive material, such as copper, nickel, molybdenum, ruthenium, cobalt, polysilicon, or tungsten, may be deposited in the via opening to form a TDV 115 electrically coupled to the stack of dies 114.

The microelectronic assemblies disclosed herein may be included in any suitable electronic device. FIGS. 15-18 illustrate various examples of apparatuses that may be included in, or that may include, one or more of any of the microelectronic assemblies disclosed herein.

Figure 15:
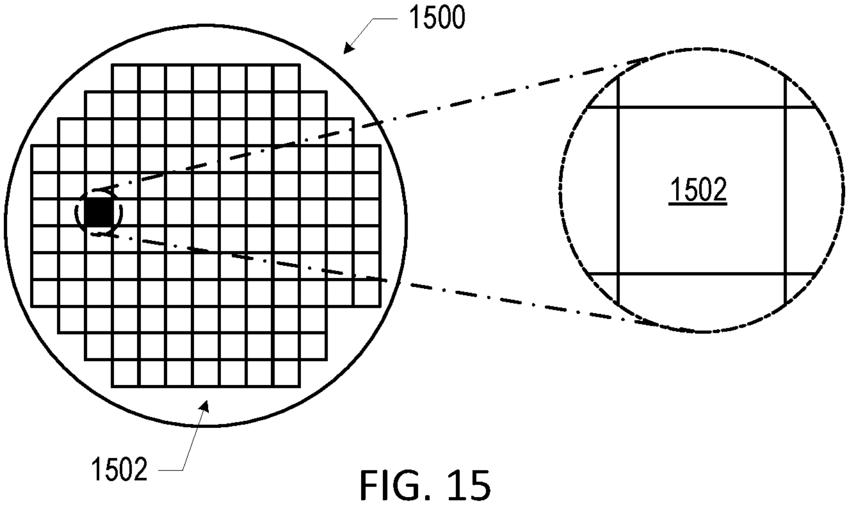
FIG. 15 is a top view of a wafer and dies that may be included in a microelectronic assembly, in accordance with any of the embodiments disclosed herein.

FIG. 15 is a top view of a wafer 1500 and dies 1502 that may be included in any of the microelectronic assemblies disclosed herein. For example, a die 1502 may serve as a die 114, or may be included in a die 114. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 16, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 18) or other logic that is configured to store information in the memory devices or execute instructions stored in the memory array.

Figure 16:
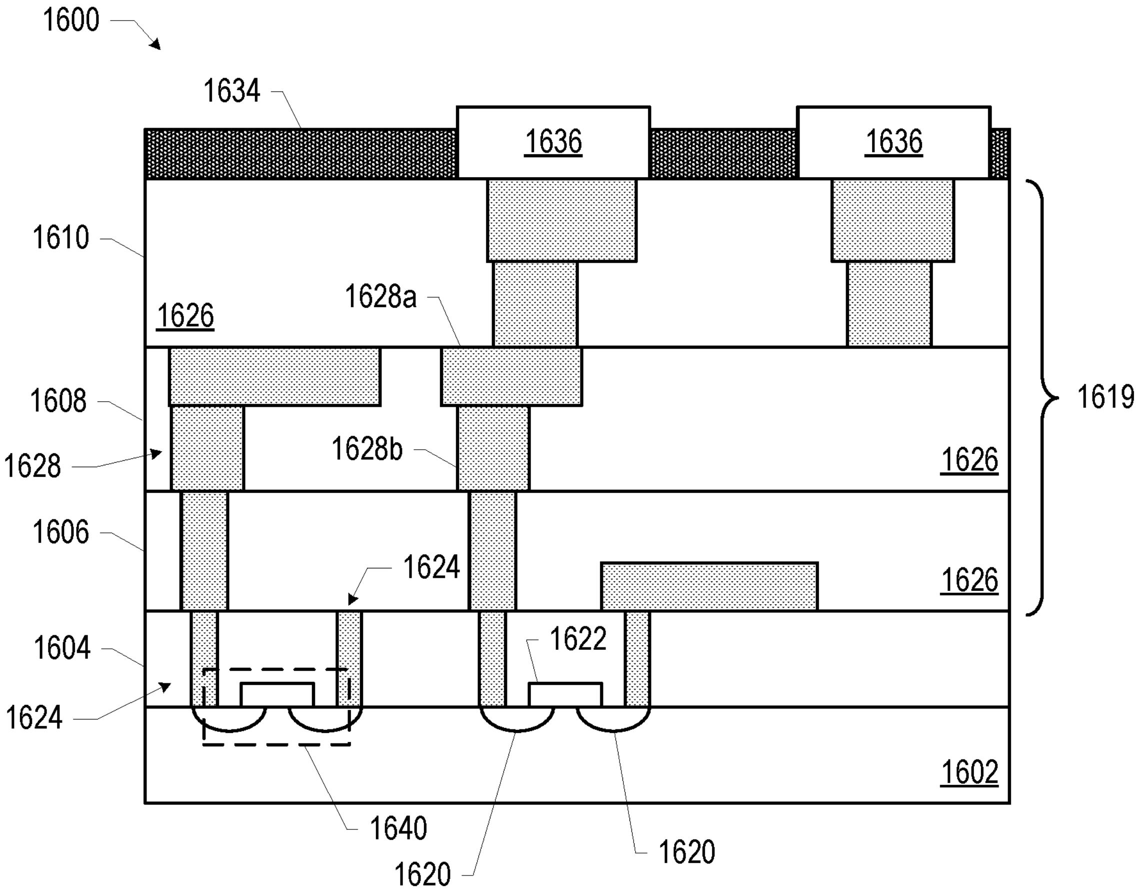
FIG. 16 is a cross-sectional side view of an IC device that may be included in a microelectronic assembly, in accordance with any of the embodiments disclosed herein.

FIG. 16 is a side, cross-sectional view of an IC device 1600 that may be included in any of the dies 114 disclosed herein. For example, an IC device 1600 (e.g., as part of a die 1502, as discussed above with reference to FIG. 15) may serve as a die 114, or may be included in a die 114. One or more of the IC devices 1600 may be included in one or more dies 1502 (FIG. 15). The IC device 1600 may be formed on a substrate 1602 (e.g., the wafer 1500 of FIG. 15) and may be included in a die (e.g., the die 1502 of FIG. 15). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 15) or a wafer (e.g., the wafer 1500 of FIG. 15).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 16 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group 111-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 16 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 16). Although a particular number of interconnect layers 1606-1610 is depicted in FIG. 16, embodiments of the present disclosure include IC devices having more or fewer interconnect layers than depicted.

In some embodiments, the interconnect structures 1628 may include lines 1628*a* and/or vias 1628*b* filled with an electrically conductive material such as a metal. The lines 1628*a* may be arranged to route electrical signals in a direction of a plane that is substantially parallel with a surface of the substrate 1602 upon which the device layer 1604 is formed. For example, the lines 1628*a* may route electrical signals in a direction in and out of the page from the perspective of FIG. 16. The vias 1628*b* may be arranged to route electrical signals in a direction of a plane that is substantially perpendicular to the surface of the substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 16. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias **1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b*** may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 16, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 17:
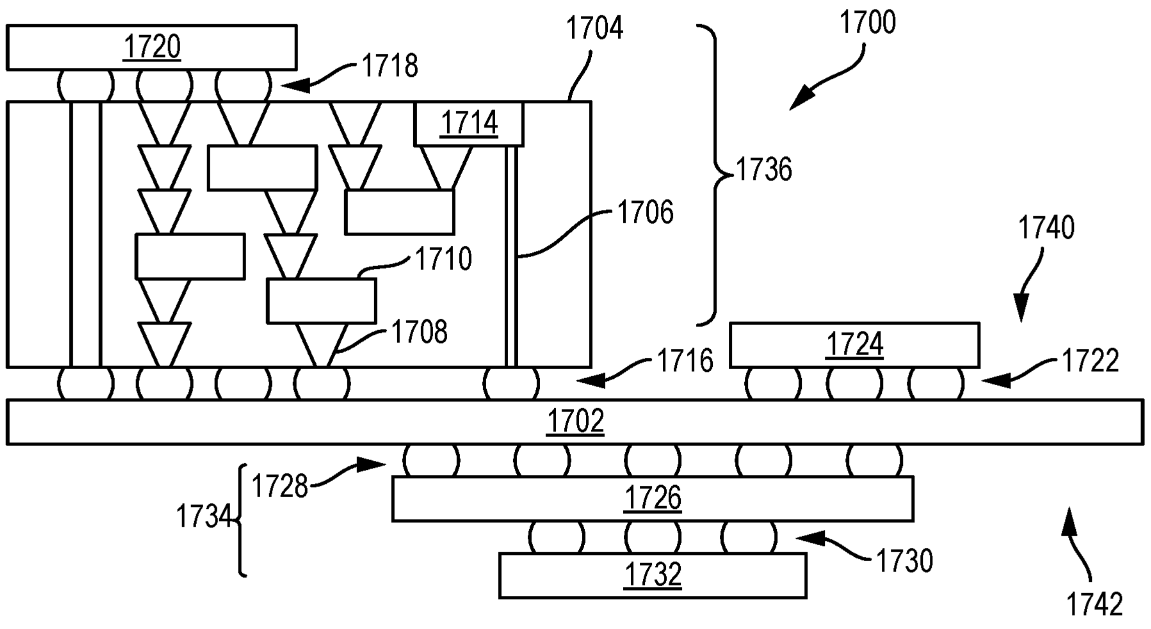
FIG. 17 is a cross-sectional side view of an IC device assembly that may include a microelectronic assembly, in accordance with any of the embodiments disclosed herein.

FIG. 17 is a side, cross-sectional view of an IC device assembly 1700 that may include any of the dies 114 and/or microelectronic assemblies 100 disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may include any of the embodiments of the microelectronic assemblies 100 disclosed herein (e.g., may include multiple stacks of dies 114 coupled together).

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 17 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 17), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 17, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 15), an IC device (e.g., the IC device 1600 of FIG. 16), or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 17, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to TSVs 1706. The package interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 17 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 18:
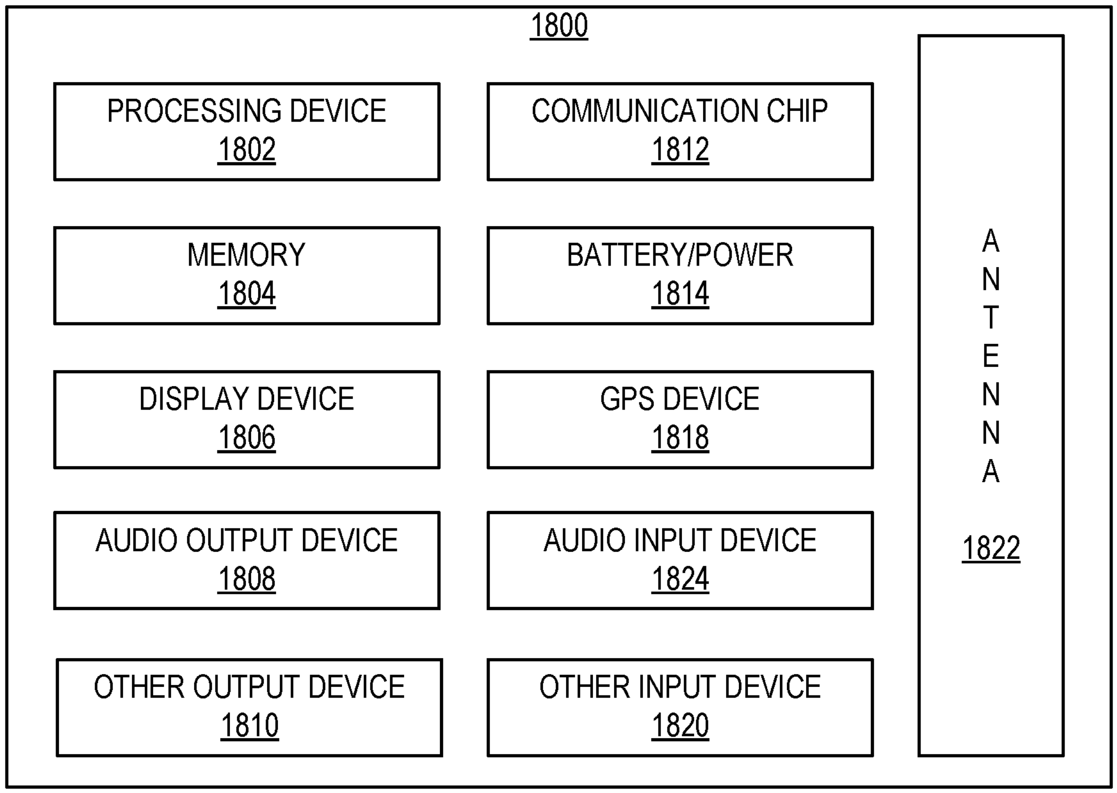
FIG. 18 is a block diagram of an example electrical device that may include a microelectronic assembly, in accordance with any of the embodiments disclosed herein.

FIG. 18 is a block diagram of an example electrical device 1800 that may include any of the microelectronic assemblies 100 disclosed herein. For example, any suitable ones of the components of the electrical device 1800 may include one or more of the IC device assemblies 1700, IC devices 1600, or dies 1502 disclosed herein. A number of components are illustrated in FIG. 18 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 18, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-M RAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UM B) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following examples pertain to further embodiments. The various features of the different embodiments may be variously combined with some features included and others excluded to suit a variety of different applications.

Example 1 is a microelectronic assembly, including a plurality of vertically stacked dies; a trench of dielectric material through the plurality of vertically stacked dies; and a plurality of conductive vias extending through the trench of dielectric material, wherein individual ones of the plurality of conductive vias are electrically coupled to individual ones of the plurality of vertically stacked dies.

Example 2 may include the subject matter of Example 1, and may further specify that the trench of dielectric material is within an interior portion of the plurality of vertically stacked dies.

Example 3 may include the subject matter of Example 1, and may further specify that the trench of dielectric material is along a perimeter of the plurality of vertically stacked dies.

Example 4 may include the subject matter of any of Examples 1-3, and may further specify that the trench of dielectric material is one of a plurality of trenches of dielectric material through the plurality of vertically stacked dies.

Example 5 may include the subject matter of any of Examples 1-4, and may further specify that the dielectric material includes silicon dioxide, silicon nitride, oxynitride, a polyimide material, or a low-k or ultra low-k dielectric.

Example 6 may include the subject matter of any of Examples 1-5, and may further specify that a material of the plurality of conductive vias includes one or more of copper, nickel, molybdenum, ruthenium, cobalt, polysilicon, and tungsten.

Example 7 may include the subject matter of any of Examples 1-6, and may further specify that a cross-section dimension of an individual one of the plurality of conductive vias is between 40 nanometers and 5 microns.

Example 8 may include the subject matter of any of Examples 1-7, and may further specify that the plurality of vertically stacked dies has a first surface and a second surface opposite the first surface, and the microelectronic assembly further including a base die at the first surface of the plurality of vertically stacked dies, the base die electrically coupled to an individual one of the plurality of conductive vias.

Example 9 may include the subject matter of Example 8, and may further specify that the base die is a controller die with logic elements, and the plurality of vertically stacked dies are memory dies.

Example 10 may include the subject matter of Example 8, and may further specify that the base die is a first base die, and the microelectronic assembly further including a second base die at the second surface of the plurality of vertically stacked dies, the second base die electrically coupled to an individual one of the plurality of conductive vias.

Example 11 may include the subject matter of Example 8, and may further specify that the base die includes a first surface and an opposing second surface, wherein the plurality of vertically stacked dies is at the second surface of the base die, and the microelectronic assembly further including a package substrate electrically coupled to the first surface of the base die.

Example 12 may include the subject matter of any of Examples 1-11, and may further specify that the plurality of vertically stacked dies includes between 2 and 32 dies.

Example 13 may include the subject matter of any of Examples 1-11, and may further specify that the plurality of vertically stacked dies includes between 32 and 128 dies.

Example 14 is a microelectronic assembly, including a plurality of vertically stacked dies; a first trench of dielectric material through the plurality of vertically stacked dies; a plurality of first conductive vias extending through the first trench of dielectric material, wherein individual ones of the plurality of first conductive vias are electrically coupled to individual ones of the plurality of vertically stacked dies; a second trench of dielectric material through the plurality of vertically stacked dies; and a plurality of second conductive vias extending through the second trench of dielectric material, wherein individual ones of the plurality of second conductive vias are electrically coupled to individual ones of the plurality of vertically stacked dies.

Example 15 may include the subject matter of Example 14, and may further specify that the first trench of dielectric material is within an interior portion of the plurality of vertically stacked dies.

Example 16 may include the subject matter of Example 14, and may further specify that the second trench of dielectric material is along a perimeter of the plurality of vertically stacked dies.

Example 17 may include the subject matter of any of Examples 14-16, and may further specify that a material of the plurality of first and second conductive vias includes one or more of copper, nickel, molybdenum, ruthenium, cobalt, polysilicon, and tungsten.

Example 18 is a computing device, including a circuit board; and an integrated circuit (IC) package electrically coupled to the circuit board, wherein the IC package includes a package substrate; a base die having a first surface and an opposing second surface, the first surface of the base die electrically coupled to the package substrate; a plurality of dies stacked vertically on the second surface of the base die; a trench of dielectric material extending through the plurality of dies; and a via extending through the trench of dielectric material, wherein the via is electrically coupled to the plurality of dies.

Example 19 may include the subject matter of Example 18, and may further specify that the base die is a controller die with logic elements, and the plurality of vertically stacked dies are memory dies.

Example 20 may include the subject matter of Example 18 or 19, and may further specify that the base die includes a first surface and an opposing second surface, wherein the plurality of vertically stacked dies is at the second surface of the base die, and the microelectronic assembly further including a package substrate electrically coupled to the first surface of the base die.

Example 21 is a method of manufacturing a microelectronic assembly, including forming a vertical stack of dies having a trench of dielectric material through the vertical stack of dies; forming a via opening through the trench of dielectric material; and depositing a conductive material in the via opening to form a via electrically coupled the vertical stack of dies.

Example 22 may include the subject matter of Example 21, and may further specify that the vertical stack of dies having a trench of dielectric material is formed on a base wafer.

Example 23 may include the subject matter of Example 21 or 22, and may further specify that forming the vertical stack of dies having a trench of dielectric material includes bonding a first wafer to the base wafer; forming a first trench through the first wafer; depositing a dielectric material in the first trench and on the first wafer; bonding a second wafer to the dielectric material on the first wafer; forming a second trench through the second wafer; and depositing the dielectric material in the second trench and on the second wafer.

Example 24 may include the subject matter of Example 23, and may further include singulating the first and second wafers into die.

Example 25 may include the subject matter of Example 21 or 22, and may further specify that forming the vertical stack of dies having a trench of dielectric material includes forming a first trench through a first wafer; bonding the first wafer to the base wafer; thinning the first wafer to expose the first trench; depositing a dielectric material in the first trench and on the first wafer; forming a second trench through a second wafer; bonding the second wafer to the first wafer; thinning the second wafer to expose the second trench; and depositing the dielectric material in the second trench and on the second wafer.

Example 26 may include the subject matter of Example 25, and may further include singulating the first and second wafers into die.

The invention claimed is:

1. A microelectronic assembly, comprising:

a plurality of vertically stacked dies;

a trench of dielectric material through the plurality of vertically stacked dies; and a plurality of conductive vias extending through the trench of dielectric material, wherein each conductive via of the plurality of conductive vias extends from a top surface of the trench to a different depth in the trench and is electrically coupled to a respective individual one of the plurality of vertically stacked dies.

2. The microelectronic assembly of claim 1, wherein the trench of dielectric material is within an interior portion of the plurality of vertically stacked dies.

3. The microelectronic assembly of claim 1, wherein the trench of dielectric material is along a perimeter of the plurality of vertically stacked dies.

4. The microelectronic assembly of claim 1, wherein the trench of dielectric material is one of a plurality of trenches of dielectric material through the plurality of vertically stacked dies.

5. The microelectronic assembly of claim 1, wherein the dielectric material includes silicon and one or more of oxygen, nitrogen, and carbon; a polyimide material; or a low-k or ultra low-k dielectric.

6. The microelectronic assembly of claim 1, wherein a material of the plurality of conductive vias includes one or more of copper, nickel, molybdenum, ruthenium, cobalt, polysilicon, and tungsten.

7. The microelectronic assembly of claim 1, wherein a cross-section dimension of an individual one of the plurality of conductive vias is between 40 nanometers and 5 microns.

8. The microelectronic assembly of claim 1, wherein the plurality of vertically stacked dies has a first surface and a second surface opposite the first surface, and the microelectronic assembly further including:

a base die at the first surface of the plurality of vertically stacked dies, the base die electrically coupled to an individual one of the plurality of conductive vias.

9. The microelectronic assembly of claim 8, wherein the base die is a controller die with logic elements, and the plurality of vertically stacked dies are memory dies.

10. The microelectronic assembly of claim 8, wherein the base die is a first base die, and the microelectronic assembly further including:

a second base die at the second surface of the plurality of vertically stacked dies, the second base die electrically coupled to an individual one of the plurality of conductive vias.

11. The microelectronic assembly of claim 8, wherein the base die includes a first surface and an opposing second surface, wherein the plurality of vertically stacked dies is at the second surface of the base die, and the microelectronic assembly further including:

a package substrate electrically coupled to the first surface of the base die.

12. The microelectronic assembly of claim 1, wherein the plurality of vertically stacked dies includes between 2 and 32 dies.

13. The microelectronic assembly of claim 1, wherein the plurality of vertically stacked dies includes between 32 and 128 dies.

14. A microelectronic assembly, comprising:

a plurality of vertically stacked dies;

a first trench of dielectric material through the plurality of vertically stacked dies;

a plurality of first conductive vias extending through the first trench of dielectric material, wherein each conductive via of the plurality of first conductive vias extends from a top surface of the first trench to a different depth in the first trench and is electrically coupled to a respective individual one of the plurality of vertically stacked dies;

a second trench of dielectric material through the plurality of vertically stacked dies; and a plurality of second conductive vias extending through the second trench of dielectric material, wherein each of the plurality of second conductive vias extends from a top surface of the second trench to a different depth in the second trench and is electrically coupled to a respective individual one of the plurality of vertically stacked dies.

15. The microelectronic assembly of claim 14, wherein the first trench of dielectric material is within an interior portion of the plurality of vertically stacked dies.

16. The microelectronic assembly of claim 14, wherein the second trench of dielectric material is along a perimeter of the plurality of vertically stacked dies.

17. The microelectronic assembly of claim 14, wherein a material of the plurality of first and second conductive vias includes one or more of copper, nickel, molybdenum, ruthenium, cobalt, polysilicon, and tungsten.

18. A computing device, comprising:

a circuit board; and an integrated circuit (IC) package electrically coupled to the circuit board, wherein the IC package comprises:

a package substrate;

a base die having a first surface and an opposing second surface, the first surface of the base die electrically coupled to the package substrate;

a plurality of dies stacked vertically on the second surface of the base die;

a trench of dielectric material extending through the plurality of dies; and a plurality of vias extending through the trench of dielectric material, wherein each via of the plurality of vias extends from a top surface of the trench to a different depth in the trench and is electrically coupled to a respective individual one of the plurality of dies.

19. The computing device of claim 18, wherein the base die is a controller die with logic elements, and the plurality of vertically stacked dies are memory dies.

20. The computing device of claim 18, wherein the base die includes a first surface and an opposing second surface, wherein the plurality of vertically stacked dies is at the second surface of the base die, and the computing device further including:

a package substrate electrically coupled to the first surface of the base die.

* * * * *